US011081042B2

(12) United States Patent
Gu et al.

(10) Patent No.: US 11,081,042 B2
(45) Date of Patent: Aug. 3, 2021

(54) GATE DRIVING UNIT, DRIVING METHOD THEREOF, GATE DRIVING CIRCUIT AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Xiaofang Gu, Beijing (CN); Xiaoye Ma, Beijing (CN); Ruifang Du, Beijing (CN); Donghui Zhang, Beijing (CN); Guodong Liu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/643,993

(22) PCT Filed: Aug. 30, 2019

(86) PCT No.: PCT/CN2019/103792
§ 371 (c)(1),
(2) Date: Mar. 3, 2020

(87) PCT Pub. No.: WO2020/043199
PCT Pub. Date: Mar. 5, 2020

(65) Prior Publication Data
US 2021/0065611 A1     Mar. 4, 2021

(30) Foreign Application Priority Data

Aug. 30, 2018 (CN) .......................... 201811001194.1

(51) Int. Cl.
*G09G 3/20* (2006.01)
*G11C 19/28* (2006.01)

(52) U.S. Cl.
CPC ........... *G09G 3/2092* (2013.01); *G11C 19/28* (2013.01); *G09G 2310/0267* (2013.01); *G09G 2310/0286* (2013.01)

(58) Field of Classification Search
CPC ......... G09G 3/2092; G09G 2310/0267; G09G 2310/0286; G11C 19/28
See application file for complete search history.

(56) References Cited

U.S. PATENT DOCUMENTS

2018/0190179 A1* 7/2018 Zhao .................... G09G 3/2092
2020/0372873 A1* 11/2020 Huang ................. G09G 3/3677

* cited by examiner

*Primary Examiner* — Robert J Michaud
(74) *Attorney, Agent, or Firm* — Nath, Goldberg & Meyer; Joshua B. Goldberg

(57) ABSTRACT

A gate driving unit includes a shift register including a forward input sub-circuit and a backward input sub-circuit, and a forward-backward scanning controller. The forward-backward scanning controller transmits a first clock signal provided by the first clock signal terminal to the forward input sub-circuit and the backward input sub-circuit for forward scanning, and transmits a second clock signal provided by the second clock signal terminal to the forward input sub-circuit and the backward input sub-circuit for backward scanning. The forward input sub-circuit transmits a signal provided by the forward-backward scanning controller to the pull-up node under control of an enabling signal provided by the forward scanning input terminal, and the backward input sub-circuit transmits the signal provided by the forward-backward scanning controller to the pull-up node under control of an enabling signal provided by the backward scanning input terminal.

20 Claims, 7 Drawing Sheets

GATE DRIVING UNIT, DRIVING METHOD THEREOF, GATE DRIVING CIRCUIT AND DISPLAY DEVICE

CROSS REFERENCE TO RELATED APPLICATIONS

This is a National Phase Application filed under 35 U.S.C. 371 as a national stage of PCT/CN2019/103792, filed on Aug. 30, 2019, an application claiming priority to Chinese patent application No. 201811001194.1, filed on Aug. 30, 2018, the entire contents of each of which are incorporated herein by reference.

TECHNICAL FIELD

The present disclosure relates to the field of display technologies, and in particular, to a gate driving unit, a method for driving a gate driving unit, a gate driving circuit, and a display device.

BACKGROUND

A gate driver on array (GOA) is a driver in which a gate driving circuit is integrated on an array substrate, the gate driving circuit includes a plurality of shift registers, and each of the plurality of shift registers corresponds to (e.g., is coupled to) a gate line for one row. With the development of technologies for the gate driving circuit, it has been generally required that the gate driving circuit can realize bidirectional scanning (i.e., forward scanning and backward scanning).

SUMMARY

Embodiments of the present disclosure provide a gate driving unit, a method for driving a gate driving unit, a gate driving circuit, and a display device.

A first aspect of the present disclosure provides a gate driving unit, including a shift register and a forward-backward scanning controller, the shift register including a forward input sub-circuit and a backward input sub-circuit, wherein the forward-backward scanning controller is coupled to a first clock signal terminal, a second clock signal terminal, the forward input sub-circuit and the backward input sub-circuit, respectively, and is configured to transmit a first clock signal provided by the first clock signal terminal to the forward input sub-circuit and the backward input sub-circuit to enable the gate driving unit to perform forward scanning, and transmit a second clock signal provided by the second clock signal terminal to the forward input sub-circuit and the backward input sub-circuit to enable the gate driving unit to perform backward scanning;

the forward input sub-circuit is coupled to a forward scanning input terminal and a pull-up node of the shift register, respectively, and is configured to transmit a signal provided by the forward-backward scanning controller to the pull-up node under control of an enabling signal provided by the forward scanning input terminal; and the backward input sub-circuit is coupled to a backward scanning input terminal and the pull-up node, respectively, and is configured to transmit the signal provided by the forward-backward scanning controller to the pull-up node under control of an enabling signal provided by the backward scanning input terminal.

In an embodiment, the forward-backward scanning controller includes a first transistor and a second transistor;

the first transistor includes a gate coupled to a forward scanning control terminal, a first electrode coupled to the first clock signal terminal, and a second electrode coupled to the forward input sub-circuit and the backward input sub-circuit, respectively, and the forward scanning control terminal is configured to provide an enabling signal for the forward scanning and provide a disabling signal for the backward scanning; and the second transistor includes a gate coupled to a backward scanning control terminal, a first electrode coupled to the second clock signal terminal, and a second electrode coupled to the forward input sub-circuit and the backward input sub-circuit, respectively, and the backward scanning control terminal is configured to provide a disabling signal for the forward scanning and provide an enabling signal for the backward scanning.

In an embodiment, the forward-backward scanning controller includes a first transistor, a second transistor, a third transistor, and a fourth transistor;

the first transistor and the third transistor are coupled in parallel between the first clock signal terminal and the shift register;

the second transistor and the fourth transistor are coupled in parallel between the second clock signal terminal and the shift register;

the first transistor includes a gate coupled to a first forward scanning control terminal, a first electrode coupled to the first clock signal terminal, and a second electrode coupled to both the forward input sub-circuit and the backward input sub-circuit;

the second transistor includes a gate coupled to a first backward scanning control terminal, a first electrode coupled to the second clock signal terminal, and a second electrode coupled to both the forward input sub-circuit and the backward input sub-circuit;

the third transistor includes a gate coupled to a second forward scanning control terminal, a first electrode coupled to the first clock signal terminal, and a second electrode coupled to both the forward input sub-circuit and the backward input sub-circuit;

the fourth transistor includes a gate coupled to a second backward scanning control terminal, a first electrode coupled to the second clock signal terminal, and a second electrode coupled to both the forward input sub-circuit and the backward input sub-circuit;

both the first forward scanning control terminal and the second forward scanning control terminal are configured to provide disabling signals during the backward scanning and provide two clock signals during the forward scanning, respectively, and when one of the two clock signals is at an enabling potential, the other of the two clock signals is at a disabling potential; and both the first backward scanning control terminal and the second backward scanning control terminal are configured to provide a disabling signal during the forward scanning and provide two clock signals during the backward scanning, and when one of the two clock signals is at an enabling potential, the other of the two clock signals is at a disabling potential.

In an embodiment, the forward input sub-circuit includes a fifth transistor, and the fifth transistor includes a gate coupled to the forward scanning input terminal, a first electrode coupled to the forward-backward scanning controller, and a second electrode coupled to the pull-up node.

In an embodiment, the backward input sub-circuit includes a sixth transistor, and the sixth transistor includes a gate coupled to the backward scanning input terminal, a first electrode coupled to the pull-up node, and a second electrode coupled to the forward-backward scanning controller.

In an embodiment, the shift register further includes a pull-up sub-circuit, a first pull-down control sub-circuit, and a first pull-down sub-circuit, wherein the first pull-down control sub-circuit and the first pull-down sub-circuit are coupled to each other at a first pull-down node;

the pull-up sub-circuit is coupled to the pull-up node, a signal output terminal, and a third clock signal terminal, respectively, and is configured to transmit a third clock signal provided by the third clock signal terminal to the signal output terminal when the pull-up node is at an enabling potential;

the first pull-down control sub-circuit is coupled to the pull-up node, the first pull-down node, a first power supply terminal, and a second power supply terminal, respectively, and is configured to transmit a signal provided by e first power supply terminal to the first pull-down node when the pull-up node is at the enabling potential, and transmit a signal provided by the second power supply terminal to the first pull-down node when the pull-up node is at a disabling potential; and the first pull-down sub-circuit is coupled to the first pull-down node, the pull-up node, the signal output terminal, and the first power supply terminal, respectively, and is configured to transmit the signal provided by the first power supply terminal to the pull-up node and the signal output terminal when the first pull-down node is at an enabling potential.

In an embodiment, the pull-up sub-circuit includes a seventh transistor and a capacitor;

the seventh transistor includes a gate coupled to the pull-up node, a first electrode coupled to the third clock signal terminal, and a second electrode coupled to the signal output terminal; and the capacitor includes a first terminal coupled to the pull-up node, and a second terminal coupled to the signal output terminal.

In an embodiment, the first pull-down control sub-circuit includes an eighth transistor, a ninth transistor, a tenth transistor, and an eleventh transistor;

the eighth transistor includes a gate and a first electrode both coupled to the second power supply terminal, and a second electrode coupled to both a gate of the ninth transistor and a first electrode of the tenth transistor;

the ninth transistor includes a first electrode coupled to the second power supply terminal, and a second electrode coupled to the first pull-down node;

the tenth transistor includes a gate coupled to the pull-up node, and a second electrode coupled to the first power supply terminal; and the eleventh transistor includes a gate coupled to the pull-up node, a first electrode coupled to the first pull-down node, and a second electrode coupled to the first power supply terminal.

In an embodiment, the first pull-down sub-circuit includes a twelfth transistor and a thirteenth transistor; and a gate of the twelfth transistor and a gate of the thirteenth transistor are both coupled to the first pull-down node, a first electrode of the twelfth transistor is coupled to the signal output terminal, a second electrode of the twelfth transistor and a second electrode of the thirteenth transistor are both coupled to the first power supply terminal, and a first electrode of the thirteenth transistor is coupled to the pull-up node.

In an embodiment, the shift register further includes a second pull-down sub-circuit and a second pull-down control sub-circuit, wherein the second pull-down control sub-circuit and the second pull-down sub-circuit are coupled to each other at a second pull-down node;

the second pull-down control sub-circuit is coupled to the pull-up node, the second pull-down node, the first power supply terminal, and a third power supply terminal, respectively, and is configured to transmit the signal provided by the first power supply terminal to the second pull-down node when the pull-up node is at the enabling potential and transmit a signal provided by the third power supply terminal to the second pull-down node when the pull-up node is at the disabling potential; and the second pull-down sub-circuit is coupled to the second pull-down node, the pull-up node, the signal output terminal, and the first power supply terminal, respectively, and is configured to transmit the signal provided by the first power supply terminal to the pull-up node and the signal output terminal when the second pull-down node is at an enabling potential.

In an embodiment, the second pull-down control sub-circuit includes a fourteenth transistor, a fifteenth transistor, a sixteenth transistor, and a seventeenth transistor;

the fourteenth transistor includes a gate and a first electrode both coupled to the third power supply terminal, and a second electrode coupled to both a gate of the fifteenth transistor and a first electrode of the sixteenth transistor;

the fifteenth transistor includes a first electrode coupled to the third power supply terminal, and a second electrode coupled to the second pull-down node;

the sixteenth transistor includes a gate coupled to the pull-up node, and a second electrode coupled to the first power supply terminal; and the seventeenth transistor includes a gate coupled to the pull-up node, a first electrode coupled to the second pull-down node, and a second electrode coupled to the first power supply terminal.

In an embodiment, the second pull-down sub-circuit includes an eighteenth transistor and a nineteenth transistor; and a gate of the eighteenth transistor and a gate of the nineteenth transistor are both coupled to the second pull-down node, a first electrode of the eighteenth transistor is coupled to the signal output terminal, a second electrode of the eighteenth transistor and a second electrode of the nineteenth transistor are both coupled to the first power supply terminal, and a first electrode of the nineteenth transistor is coupled to the pull-up node.

In an embodiment, the shift register further includes a reset sub-circuit, the reset sub-circuit is coupled to a reset terminal, the first power supply terminal, the pull-up node, and the signal output terminal, respectively, and is configured to transmit the signal provided by the first power supply terminal to the pull-up node and the signal output terminal when the reset terminal is at an enabling potential.

In an embodiment, the reset sub-circuit includes a twentieth transistor and a twenty-first transistor, a gate of the twentieth transistor and a gate of the twenty-first transistor are both coupled to the reset terminal, a first electrode of the twentieth transistor is coupled to the pull-up node, a second electrode of the twentieth transistor and a second electrode of the twenty-first transistor are both coupled to the first power supply terminal, and a first electrode of the twenty-first transistor is coupled to the signal output terminal.

A second aspect of the present disclosure provides a method for driving a gate driving unit, wherein the gate driving unit is the gate driving unit according to any one of the foregoing embodiments of the present disclosure, and the method includes:

transmitting, by the forward-backward scanning controller, the first clock signal provided by the first clock signal terminal to the forward input sub-circuit and the backward input sub-circuit to perform the forward scanning;

during a precharge stage of the forward scanning, providing, by the forward scanning input terminal, the enabling signal, and transmitting, by the forward input sub-circuit, the first clock signal that is at an enabling potential and provided by the forward-backward scanning controller to the pull-up node;

during a reset stage of the forward scanning, providing, by the backward scanning input terminal, the enabling signal, and transmitting, by the backward input sub-circuit, the first clock signal that is at a disabling potential and provided by the forward-backward scanning controller to the pull-up node;

transmitting, by the forward-backward scanning controller, the second clock signal provided by the second clock signal terminal to the forward input sub-circuit and the backward input sub-circuit to perform the backward scanning;

during a precharge stage of the backward scanning, providing, by the backward scanning input terminal, the enabling signal, and transmitting, by the backward input sub-circuit, the second clock signal that is at an enabling potential and provided by the forward-backward scanning controller to the pull-up node; and during a reset stage of the backward scanning, providing, by forward scanning input terminal, the enabling signal, and transmitting, by the forward input sub-circuit, the second clock signal that is at a disabling potential and provided by the forward-backward scanning controller to the pull-up node.

In an embodiment, the gate driving unit is the gate driving unit as shown in FIG. 3;

the transmitting, by the forward-backward scanning controller, the first clock signal provided by the first clock signal terminal to the forward input sub-circuit and the backward input sub-circuit to perform the forward scanning includes: providing, by the forward scanning control terminal, the enabling signal to electrically couple the first electrode and the second electrode of the first transistor to each other, so as to transmit the first clock signal to the forward input sub-circuit and the backward input sub-circuit; and the transmitting, by the forward-backward scanning controller, the second clock signal provided by the second clock signal terminal to the forward input sub-circuit and the backward input sub-circuit to perform the backward scanning includes: providing, by the backward scanning control terminal, the enabling signal to electrically couple the first electrode and the second electrode of the second transistor to each other, so as to transmit the second clock signal to the forward input sub-circuit and the backward input sub-circuit.

In an embodiment, the gate driving unit is the gate driving unit as shown in FIG. 4;

the transmitting, by the forward-backward scanning controller, the first clock signal provided by the first clock signal terminal to the forward input sub-circuit and the backward input sub-circuit to perform the forward scanning includes:

providing, by both the first forward scanning control terminal and the second forward scanning control terminal, two clock signals, wherein when one of the two clock signals is at an enabling potential, the other of the two clock signals is at a disabling potential; in a case where the signal provided by the first forward scanning control terminal is at the enabling potential, the first electrode and the second electrode of the first transistor are electrically coupled to each other so as to transmit the first clock signal to the forward input sub-circuit and the backward input sub-circuit; in a case where the signal provided by the second forward scanning control terminal is at the enabling potential, the first electrode and the second electrode of the third transistor are electrically coupled to each other so as to transmit the first clock signal to the forward input sub-circuit and the backward input sub-circuit; and the transmitting, by the forward-backward scanning controller, the second clock signal provided by the second clock signal terminal to the forward input sub-circuit and the backward input sub-circuit to perform the backward scanning includes:

providing, by both the first backward scanning control terminal and the second backward scanning control terminal, two clock signals, wherein when one of the two clock signals is at an enabling potential, the other of the two clock signals is at a disabling potential; in a case where the signal provided by the first backward scanning control terminal is at the enabling potential, the first electrode and the second electrode of the second transistor are electrically coupled to each other so as to transmit the second clock signal to the forward input sub-circuit and the backward input sub-circuit; in a case where the signal provided by the second backward scanning control terminal is at the enabling potential, the first electrode and the second electrode of the fourth transistor are electrically coupled to each other so as to transmit the second clock signal to the forward input sub-circuit and the backward input sub-circuit.

In an embodiment, the gate driving unit is the gate driving unit as shown in FIG. 7a or 7b; and each of the signal provided by the second power supply terminal and the signal provided by the third power supply terminal is a signal switching between an enabling potential and a disabling potential; and at any time, one of the signal provided by the second power supply terminal and the signal provided by the third power supply terminal is at the enabling potential, and the other of the signal provided by the second power supply terminal and the signal provided by the third power supply terminal is at the disabling potential.

A third aspect of the present disclosure provides a gate driving circuit, including a plurality of gate driving units cascaded in respective stages, wherein each of the plurality of gate driving units is the gate driving unit according to any one of the foregoing embodiments of the present disclosure;

except the gate driving unit in a last stage, a signal output terminal of each of the gate driving units in the remaining stages of the plurality of gate driving units is coupled to the forward scanning input terminal of the gate driving unit in a corresponding next stage; and except the gate driving unit in a first stage, the signal output terminal of each of the gate driving units in the remaining stages of the plurality of gate driving units is coupled to the backward scanning input terminal of the gate driving unit in a corresponding previous stage.

A fourth aspect of the present disclosure provides a display device, including the gate driving circuit according to the foregoing embodiment of the present disclosure.

BRIEF DESCRIPTION OF THE DRAWINGS

The accompanying drawings, which are included to provide a further understanding of the present disclosure and constitute a part of this specification, are for explaining the principle of the present disclosure together with the following exemplary embodiments, but not for limiting the present disclosure. In the drawings.

DETAILED DESCRIPTION

Figure 1:
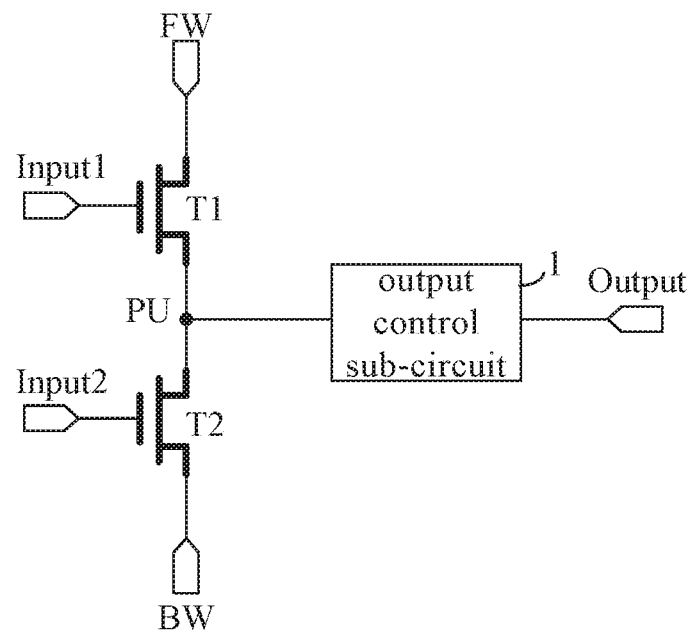
FIG. 1 is a schematic circuit diagram of a shift register suitable for bidirectional scanning according to an embodiment of the present disclosure.

FIG. 1 is a schematic circuit diagram of a shift register suitable for bidirectional scanning. As shown in FIG. 1, the shift register includes a forward input transistor T1, a backward input transistor T2, and an output control sub-circuit (e.g., output controller) 1. The forward input transistor T1, the backward input transistor T2, and the output control sub-circuit 1 are coupled to each other at a pull-up node PU of the shift register, and the output control sub-circuit 1 may be coupled to a signal output terminal Output. Taking both the forward input transistor T1 and the backward input transistor T2 being N-type transistors as an example, during forward scanning, the forward scanning control terminal FW continuously provides a high level signal, the backward scanning control terminal BW continuously provides a low level signal, and a forward scanning input terminal Input1 provides an enabling signal to a gate of the forward input transistor T1, such that the forward input transistor T1 is turned on; during backward scanning, the forward scanning control terminal FW continuously provides a low level signal, the backward scanning control terminal BW continuously provides a high level signal, and a backward scanning input terminal Input2 provides an enabling signal to a gate of the backward input transistor T2, such that the backward input transistor T2 is turned on. During the forward scanning, a gate-source voltage Vgs of the forward input transistor T1 is greater than a threshold voltage of the forward input transistor T1 for a long time, resulting in a negative shift in the threshold voltage (i.e., a decrease in the threshold voltage) of the forward input transistor T1. As such, when switching to the backward scanning, the forward input transistor T1 has a large leakage current due to its reduced threshold voltage, making it difficult for the pull-up node PU to reach a high level potential. Thus, an abnormal operation may occur in the shift register. Similarly, during the backward scanning, a threshold voltage of the backward input transistor T2 is shifted in the negative direction, such that when the shift register is switched to the forward scanning, a leakage current of the backward input transistor T2 is large, which may also causes the shift register to operate abnormally.

Therefore, when the shift register suitable for bidirectional scanning shown in FIG. 1 performs the forward or backward scanning for a long time, the threshold voltage of a part of the transistors may shift, which may cause an abnormal operation when the shift register switches a scanning direction.

Some embodiments of the present disclosure provide a gate driving unit, a method for driving a gate driving unit, a gate driving circuit, and a display device. The embodiments are described in detail below with reference to the accompanying drawings. It is to be understood that the embodiments described below are merely for illustrating and explaining the present disclosure but are not intended to limit the present disclosure.

It should be noted that each of the transistors in the embodiments of the present disclosure may be a thin film transistor or a field effect transistor or other switching devices having the same characteristics. Of first and second electrodes of each of the transistors, one may be a source of the transistor, and the other may be a drain of the transistor.

In addition, an "enabling potential" in the present disclosure is a potential at which a transistor is turned on, and a "disabling potential" is a potential at which the transistor is turned off; the "enabling signal" is a signal capable of turning on the transistor, and a "disabling signal" is a signal capable of turning off the transistor. In a case where the transistor is an N-type transistor, the enabling potential refers to a high level potential, and the disabling potential refers to a low level potential, the enabling signal refers to a high level signal, and the disabling signal refers to a low level signal. In a case where the transistor is a P-type transistor, the enabling potential refers to a low level potential, and the enabling signal refers to a low level signal, the disabling potential refers to a high level potential, and the disabling signal refers to a high level signal.

Hereinafter, description will be made by taking each transistor being an N-type transistor as an example. In this case, the enabling potential is a high level potential, and the disabling potential is a low level potential. However, the present disclosure is not limited thereto. For example, one of ordinary skill in the art may replace some or all of the transistors in the described examples with P-type transistors.

In the present disclosure, the terms "first," "second," and the like are used only for distinguishing one feature from another, but not for denoting any order or importance.

Figure 2:
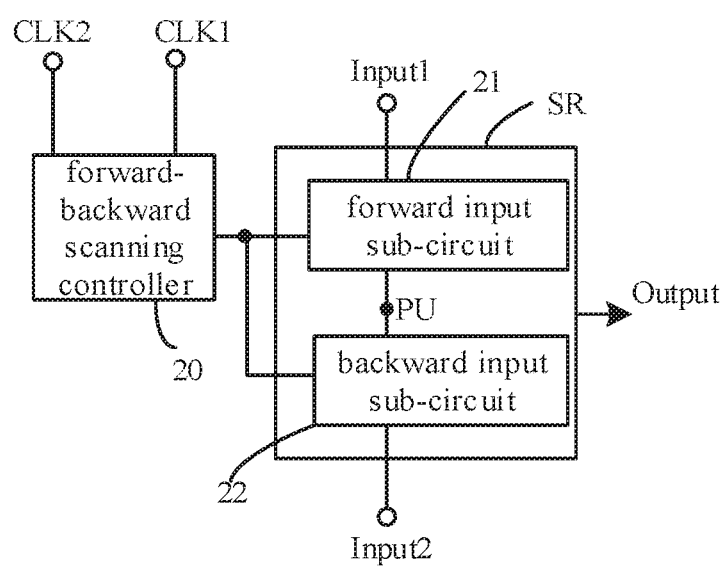
FIG. 2 is a schematic diagram showing a structure of a gate driving unit provided by an embodiment of the present disclosure.

FIG. 2 is a schematic diagram showing a structure of a gate driving unit according to an embodiment of the present disclosure. As shown in FIG. 2, the gate driving unit includes a shift register SR and a forward-backward scanning controller 20, and the shift register SR includes a forward input sub-circuit 21 and a backward input sub-circuit 22.

For example, the forward-backward scanning controller 20 is coupled to a first clock signal terminal CLK1, a second clock signal terminal CLK2, the forward input sub-circuit 21 and the backward input sub-circuit 22, may transmit a first clock signal provided by the first clock signal terminal CLK1 to the forward input sub-circuit 21 and the backward input sub-circuit 22 to enable the gate driving unit to perform forward scanning, and may transmit a second clock signal provided by the second clock signal terminal CLK2 to the forward input sub-circuit 21 and the backward input sub-circuit 22 to enable the gate driving unit to perform backward scanning.

The forward input sub-circuit 21 is coupled to the forward scanning input terminal Input1 and the pull-up node PU of the shift register, and may transmit a signal provided by the forward-backward scanning controller 20 to the pull-up node PU under the control of the enabling signal provided by the forward scanning input terminal Input 1. It should be noted that the shift register SR may control an output of the signal output terminal Output in accordance with a potential of the pull-up node PU of the shift register SR. For example, the shift register SR shown in FIGS. 6 to 8b, which includes a first power supply terminal V1 and a third clock signal terminal CLK3, may transmit a third clock signal provided by the third clock signal terminal CLK3 to the signal output terminal Output when the pull-up node PU is at the enabling potential, and may transmit a signal provided by the first power supply terminal V1 to the signal output terminal Output when the pull-up node PU is at the disabling potential, which will be further described below with reference to FIGS. 6 to 8b.

The backward input sub-circuit 22 is coupled to the backward scanning input terminal Input2 and the pull-up node PU, and may transmit the signal provided by the forward-backward scanning controller 20 to the pull-up node PU under the control of the enabling signal provided by the backward scanning input terminal Input2.

During the gate driving unit provided by the present disclosure performing the forward scanning, the forward-backward scanning controller 20 provides the forward input sub-circuit 21 and the backward input sub-circuit 22 of the shift register SR with the first clock signal. At this time, the sources of transistors, which receive the first clock signal, of the forward input sub-circuit 21 and the backward input sub-circuit 22 are no longer in a constant voltage state. Thus, the phenomenon that the threshold voltages of the transistors of the forward input sub-circuit 21 and the backward input sub-circuit 22 drift (or shift) is reduced, and the problem of abnormal operation of the shift register caused by the drift of the threshold values of the transistors is reduced.

Similarly, during the gate driving unit performing the backward scanning, the forward-backward scanning controller 20 provides the forward input sub-circuit 21 and the backward input sub-circuit 22 of the shift register SR with the second clock signal. At this time, the sources of the transistors, which receive the second clock signal, of the forward input sub-circuit 21 and the backward input sub-circuit 22 are no longer in a constant voltage state. Thus, the phenomenon that the threshold voltages of the transistors of the forward input sub-circuit 21 and the backward input sub-circuit 22 drift is reduced, and the problem of abnormal operation of the shift register due to the drift of the threshold values of the transistors is further reduced.

Figure 3:
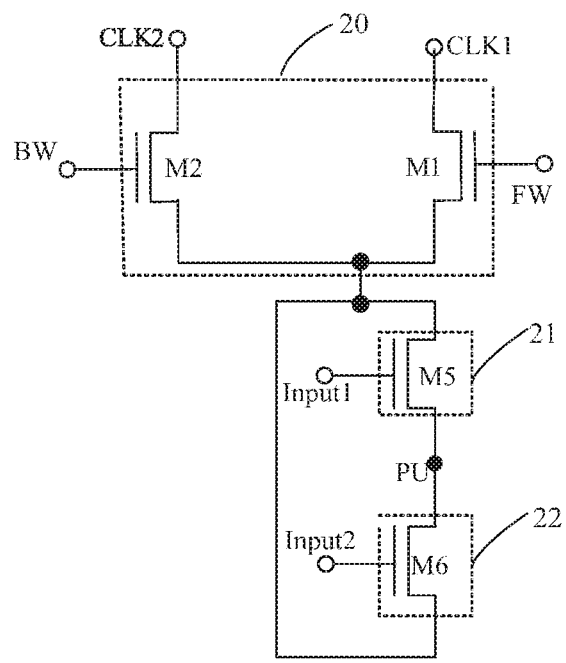
FIG. 3 is a schematic diagram showing a first exemplary structure of a forward-backward scanning controller, a forward input sub-circuit and a backward input sub-circuit of the gate driving unit shown in FIG. 2.

FIG. 3 is a schematic diagram showing a first exemplary structure of the forward-backward scanning controller 20, the forward input sub-circuit 21 and the backward input sub-circuit 22 of the gate driving unit shown in FIG. 2. As shown in FIG. 3, the forward-backward scanning controller 20 may include a first transistor M1 and a second transistor M2. A gate of the first transistor M1 is coupled to the forward scanning control terminal FW, a first electrode of the first transistor M1 is coupled to the first clock signal terminal CLK1, and a second electrode of the first transistor M1 is coupled to the forward input sub-circuit 21 and the backward input sub-circuit 22, respectively. A gate of the second transistor M2 is coupled to the backward scanning control terminal BW, a first electrode of the second transistor M2 is coupled to the second clock signal terminal CLK2, and a second electrode of the second transistor M2 is coupled to the forward input sub-circuit 21 and the backward input sub-circuit 22, respectively.

For example, the forward scanning control terminal FW may provide the enabling signal during forward scanning and provide the disabling signal during backward scanning, and the backward scanning control terminal BW may provide the disabling signal during forward scanning and provide the enabling signal during backward scanning.

In at least one embodiment of the present disclosure, as shown in FIG. 3, the forward input sub-circuit 21 includes a fifth transistor M5, a gate of the fifth transistor M5 is coupled to the forward scanning input terminal Input1, a first electrode of the fifth transistor M5 is coupled to the forward-backward scanning controller 20, and a second electrode of the fifth transistor M5 is coupled to the pull-up node PU. The backward input sub-circuit 22 includes a sixth transistor M6, a gate of the sixth transistor M6 is coupled to the backward scanning input terminal Input2, a first electrode of the sixth transistor M6 is coupled to the pull-up node KJ, and a second electrode of the sixth transistor M6 is coupled to the forward-backward scanning controller 20.

In FIG. 3, when the gate driving unit performs the forward scanning, the forward scanning control terminal FW continuously provides the enabling signal, and the backward scanning control terminal BW continuously provides the disabling signal. At this time, the first transistor M1 is turned on, and the second transistor M2 is turned off, such that the first clock signal provided by the first clock signal terminal CLK1 is transmitted to the first electrode of the fifth transistor M5 and the second electrode of the sixth transistor M6. The first clock signal is not maintained unchanged, and thus the threshold voltage shift of the first transistor M1, the fifth transistor M5 and the sixth transistor M6 can be prevented.

Similarly, when the gate driving unit performs the backward scanning, the forward scanning control terminal FW continuously provides the disabling signal, and the backward scanning control terminal BW continuously provides the enabling signal. At this time, the first transistor M1 is turned off, and the second transistor M2 is turned on, such that the second clock signal provided by the second clock signal terminal CLK2 is transmitted to the first electrode of the fifth transistor M5 and the second electrode of the sixth transistor M6. The second clock signal is not maintained unchanged, and thus the threshold voltage shift of the second transistor M2, the fifth transistor M5 and the sixth transistor M6 can be prevented.

Figure 4:
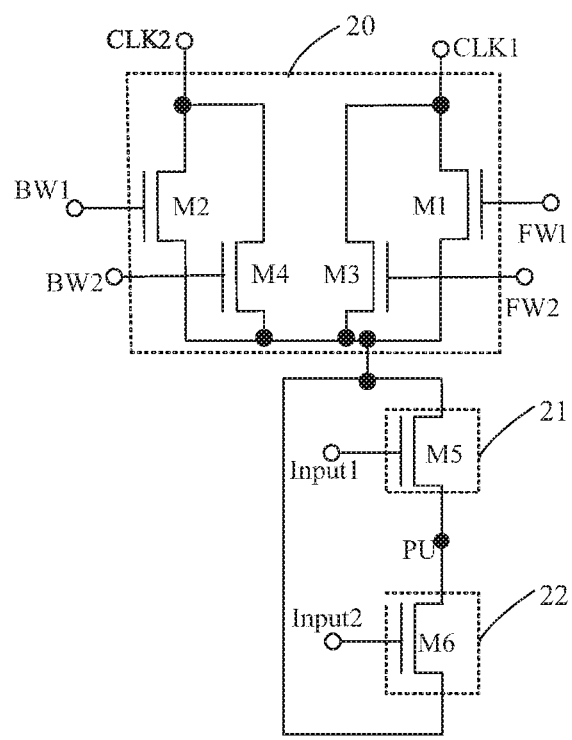
FIG. 4 is a schematic diagram showing a second exemplary structure of a forward-backward scanning controller, a forward input sub-circuit and a backward input sub-circuit of the gate driving unit shown in FIG. 2.

FIG. 4 is a schematic diagram showing another exemplary structure of the forward-backward scanning controller 20, the forward input sub-circuit 21 and the backward input sub-circuit 22 of the gate driving unit shown in FIG. 2. As shown in FIG. 4, the forward-backward scanning controller 20 may include the first transistor M1, the second transistor M2, a third transistor M3, and a fourth transistor M4. For example, the first transistor M1 and the third transistor M3 may be coupled in parallel between the first clock signal terminal CLK1 and the shift register SR (i.e., the forward input sub-circuit 21 and the backward input sub-circuit 22). The second transistor M2 and the fourth transistor M4 may be coupled in parallel between the second clock signal terminal CLK2 and the shift register SR (i.e., the forward input sub-circuit 21 and the backward input sub-circuit 22).

The gate of the first transistor M1 is coupled to a first forward scanning control terminal FW1, the first electrode of the first transistor M1 is coupled to the first clock signal terminal CLK1, and the second electrode of the first transistor M1 is coupled to the forward input sub-circuit 21 and the backward input sub-circuit 22, respectively.

The gate of the second transistor M2 is coupled to a first backward scanning control terminal BW1, the first electrode of the second transistor M2 is coupled to the second clock signal terminal CLK2, and the second electrode of the second transistor M2 is coupled to the forward input sub-circuit 21 and the backward input sub-circuit 22, respectively.

A gate of the third transistor M3 is coupled to a second forward scanning control terminal FW2, a first electrode of the third transistor M3 is coupled to the first clock signal terminal CLK1, and a second electrode of the third transistor M3 is coupled to the forward input sub-circuit 21 and the backward input sub-circuit 22, respectively.

A gate of the fourth transistor M4 is coupled to a second backward scanning control terminal BW2, a first electrode of the fourth transistor M4 is coupled to the second clock signal terminal CLK2, and a second electrode of the fourth transistor M4 is coupled to the forward input sub-circuit 21 and the backward input sub-circuit 22, respectively.

Figure 5A:
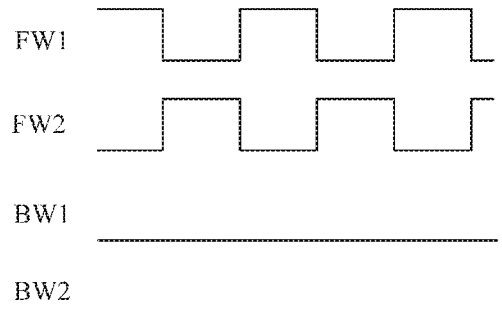
FIG. 5a is a timing diagram of signals provided by, for example, a first forward scanning control terminal, a second forward scanning control terminal, a first backward scanning control terminal and a second backward scanning control terminal shown in FIG. 4 during forward scanning.
Figure 5B:
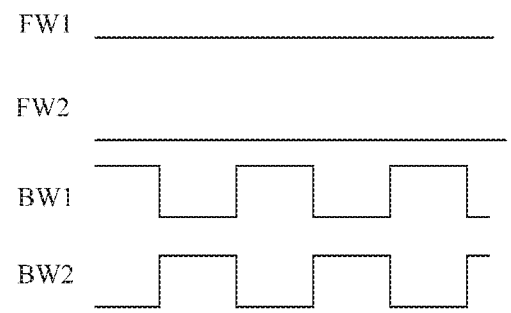
FIG. 5b is a timing diagram of signals provided by the first forward scanning control terminal, the second forward scanning control terminal, the first backward scanning control terminal and the second backward scanning control terminal shown in FIG. 4 during backward scanning.

FIG. 5a is a timing diagram of signals provided by, for example, the first forward scanning control terminal FW1, the second forward scanning control terminal FW2, the first backward scanning control terminal BW1 and the second backward scanning control terminal BW2 shown in FIG. 4 during the forward scanning, and FIG. 5b is a timing diagram of signals provided by, for example, the first forward scanning control terminal FW1, the second forward scanning control terminal FW2, the first backward scanning control terminal BW1 and the second backward scanning control terminal BW2 shown in FIG. 4 during the backward scanning. As shown in FIGS. 5a and 5b, the first forward scanning control terminal FW1 and the second forward scanning control terminal FW2 both may provide the disabling signals during the backward scanning and may provide clock signals during the forward scanning, and when one of two clock signals provided by the first forward scanning control terminal FW1 and the second forward scanning control terminal FW2 is at the enabling potential, the other of the two clock signals is at the disabling potential. The first backward scanning control terminal BW1 and the second backward scanning control terminal BW2 both may provide the disabling signal during the forward scanning and may provide clock signals during the backward scanning, and when one of two clock signals provided by the first backward scanning control terminal BW1 and the second backward scanning control terminal BW2 is at the enabling potential, the other of these two clock signals is at the disabling potential. For example, the clock signal provided by each of the first forward scanning control terminal FW1, the second forward scanning control terminal FW2, the first backward scanning control terminal BW1 and the second backward scanning control terminal BW2 may have a duty ratio of 50% and a period of 4 s, i.e., the clock signal is switched between a high potential of 2 s duration and a low potential of 2 s duration.

In addition, as in FIG. 3, the forward input sub-circuit 21 in FIG. 4 also includes the fifth transistor M5, the backward input sub-circuit 22 in FIG. 4 also includes the sixth transistor M6, and the connection (or coupling) relationship of each of the fifth transistor M5 and the sixth transistor M6 may be referred to the description of FIG. 3, and is not repeated here.

In FIG. 4, when the gate driving unit performs the forward scanning, the first backward scanning control terminal BW1 and the second backward scanning control terminal BW2 both provide the disabling signals, the first forward scanning control terminal FW1 and the second forward scanning control terminal FW2 provide the clock signals, and when one of these two clock signals is at a high potential, the other of these two clock signals is at a low potential. Accordingly, during the forward scanning, the second transistor M2 and the fourth transistor M4 are both turned off, and the first transistor M1 and the third transistor M3 are alternately turned on, such that the first clock signal provided by the first clock signal terminal CLK1 is transmitted to the first electrode of the fifth transistor M5 and the second electrode of the sixth transistor M6 through the turned-on one of the first transistor M1 and the third transistor M3. In this case, the threshold voltage shift of the first transistor M1, the third transistor M3, the fifth transistor M5 and the sixth transistor M6 can be prevented.

When the gate driving unit performs the backward scanning, the first forward scanning control terminal FW1 and the second forward scanning control terminal FW2 both provide the disabling signals, the first backward scanning control terminal BW1 and the second backward scanning control terminal BW2 provide the clock signals, and when one of these two clock signals is at a high potential, the other of these two clock signals is at a low potential. Accordingly, during the backward scanning, the first transistor M1 and the third transistor M3 are both turned off, and the second transistor M2 and the fourth transistor M4 are alternately turned on, such that the second clock signal provided by the second clock signal terminal CLK2 is transmitted to the first electrode of the fifth transistor M5 and the second electrode of the sixth transistor M6 through the turned-on one of the second transistor M2 and the fourth transistor M4. In this case, the threshold voltage shift of the second transistor M2, the fourth transistor M4, the fifth transistor M5 and the sixth transistor M6 can be prevented.

Compared with FIG. 3, when the forward-backward scanning controller 20 has the structure shown in FIG. 4, the first transistor M1 and the third transistor M3 are alternately turned on during the forward scanning, and the second transistor M2 and the fourth transistor M4 are also alternately turned on during the backward scanning, thereby avoiding the problem of short lifetime of the transistors due to being turned on for a long time. In addition, taking the first transistor M1 as an example, when the first forward scanning control terminal FW1 is at a high level potential and the second forward scanning control terminal FW2 is at a low level potential, the threshold voltage of the first transistor M1 starts a positive drift (or shift), and when the first forward scanning control terminal FW1 is at a low level potential and the second forward scanning control terminal FW2 is at a high level potential, the threshold voltage of the first transistor M1 starts a negative drift. Therefore, with the alternating change of the potential of the first forward scanning control terminal FW1 and the alternating change of the potential of the second forward scanning control terminal FW2, the threshold voltage of the first transistor M1 alternately undergoes the positive drift and the negative drift which cancel each other out, such that the threshold voltage of the first transistor M1 has a little drift as a whole, thereby further prolonging the lifetime of the transistor.

Figure 6:
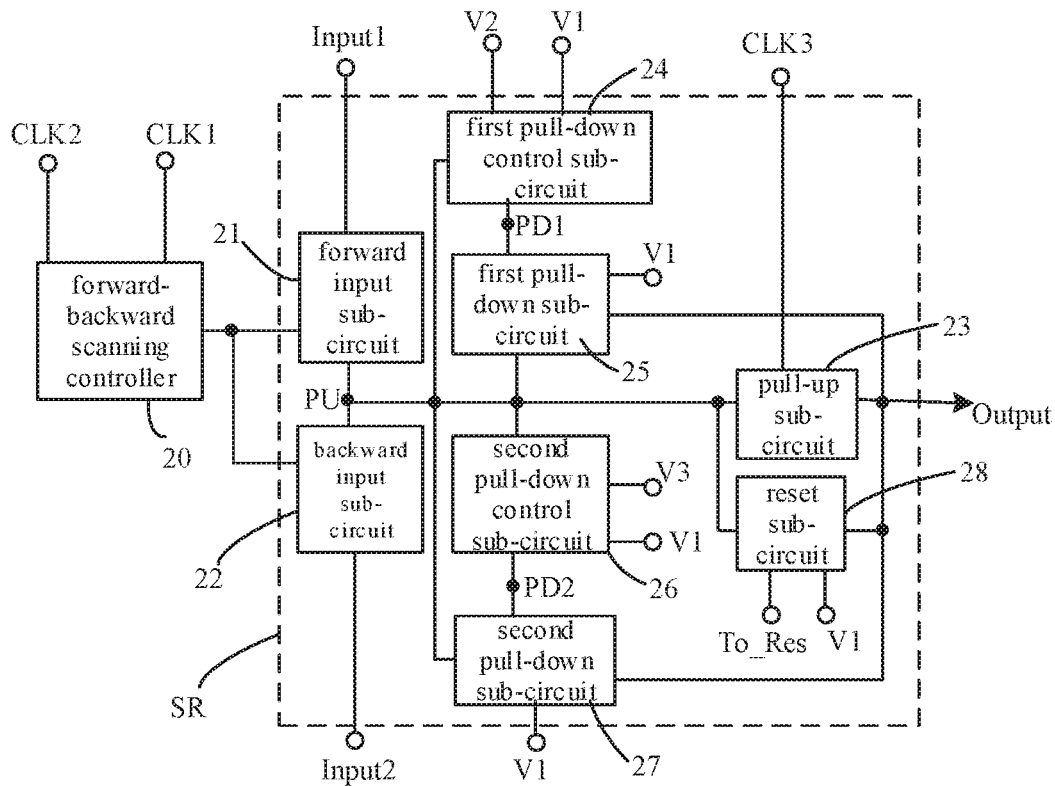
FIG. 6 is a schematic diagram showing a structure of a gate driving unit provided by an embodiment of the present disclosure.

FIG. 6 is a schematic diagram showing a structure of a gate driving unit according to an embodiment of the present disclosure. As shown in FIG. 6, the gate driving unit includes the forward-backward scanning controller 20 and the shift register SR, and the shift register SR includes the forward input sub-circuit 21 and the backward input sub-circuit 22. In addition, the shift register SR further includes a pull-up sub-circuit 23, a first pull-down control sub-circuit 24 and a first pull-down sub-circuit 25, and the first pull-down control sub-circuit 24 and the first pull-down sub-circuit 25 are all coupled to a first pull-down node PD1.

The pull-up sub-circuit 23 is coupled to the pull-up node PU, a third clock signal terminal CLK3 and the signal output terminal Output, respectively, and may, in response to the control of the potential of the pull-up node PU, transmit a third clock signal provided by the third clock signal terminal CLK3 to the signal output terminal Output, for example, when the pull-up node PU is at the enabling potential.

The first pull-down control sub-circuit 24 is coupled to the pull-up node PU, the first pull-down node PD1, a first power supply terminal V1 and a second power supply terminal V2, respectively, and may, in response to the control of the potential of the pull-up node PU, transmit a signal provided by the first power supply terminal V1 to the first pull-down node PD1 when the pull-up node PU is at the enabling potential and transmit a signal provided by the second power supply terminal V2 to the first pull-down node PD1 when the pull-up node PU is at the disabling potential.

The first pull-down sub-circuit 25 is coupled to the first pull-down node PD1, the pull-up node PU, the signal output terminal Output and the first power supply terminal V1, respectively, and may, in response to the control of the potential of the first pull-down node PD1, transmit the signal provided by the first power supply terminal V1 to the pull-up node PU and the signal output terminal Output, for example, when the first pull-down node PD1 is at the enabling potential.

Further, as shown in FIG. 6, the shift register SR further includes a second pull-down control sub-circuit 26 and a second pull-down sub-circuit 27, and the second pull-down control sub-circuit 26 and the second pull-down sub-circuit 27 are all coupled to a second pull-down node PD2.

The second pull-down control sub-circuit 26 is coupled to the pull-up node PU, the second pull-down node PD2, the first power supply terminal V1 and a third power supply terminal V3, respectively, and may, in response to the control of the potential of the pull-up node PU, transmit the signal provided by the first power supply terminal V1 to the second pull-down node PD2 for example when the pull-up node PU is at the enabling potential and transmit the signal provided by the third power supply terminal V3 to the second pull-down node PD2 for example when the pull-up node PU is at the disabling potential.

The second pull-down sub-circuit 27 is coupled to the second pull-down node PD2, the pull-up node PU, the signal output terminal Output and the first power supply terminal V1, respectively, and may, in response to the control of the potential of the second pull-down node PD2, transmit the signal provided by the first power supply terminal V1 to the pull-up node PU and the signal output terminal Output for example when the second pull-down node PD2 is at the enabling potential.

Each of the signal provided by the second power supply terminal V2 and the signal provided by the third power supply terminal V3 is switched between the enabling potential and the disabling potential, and at any time, one of the signal provided by the second power supply terminal V2 and the signal provided by the third power supply terminal V3 is at the enabling potential, whereas the other of the signal provided by the second power supply terminal V2 and the signal provided by the third power supply terminal V3 is at the disabling potential.

By switching the signal provided by the second power supply terminal V2 between the enabling potential and the disabling potential and switching the signal provided by the third power supply terminal V3 between the enabling potential and the disabling potential, the first pull-down control sub-circuit 24 and the second pull-down control sub-circuit 26 can operate alternately, and the first pull-down sub-circuit 25 and the second pull-down sub-circuit 27 can operate alternately, thereby avoiding the problem of a shortened lifetime or a threshold voltage shift of transistors therein due to a long-time operation.

For example, each of the second power supply terminal V2 and the third power supply terminal V3 may perform switching between the enabling potential and the disabling potential upon completion of the current scanning period and entry into the next scanning period (i.e., between every adjacent two scanning periods), in the N-th scanning period, the second power supply terminal V2 is at the enabling potential and the third power supply terminal V3 is at the disabling potential; in the (N+1)-th scanning period, the second power supply terminal V2 is at the disabling potential, and the third power supply terminal V3 is at the enabling potential. Alternatively, a switching time for switching each of the second power supply terminal V2 and the third power supply terminal V3 between a high potential and a low potential may be set according to actual requirements.

In at least one example, the shift register SR further includes a reset sub-circuit 28. The reset sub-circuit 28 is coupled to a reset terminal To_Res, the first power supply terminal V1, the pull-up node PU and the signal output terminal Output, respectively, and may, in response to the control of the potential of the reset terminal To_Res, transmit the signal provided by the first power supply terminal V1 to the pull-up node PU and the signal output terminal Output, for example, when the reset terminal To_Res is at the enabling potential. The reset terminal To_Res may be at the enabling potential in an initialization stage at the beginning of each scanning period, thereby resetting the pull-up node PU and the signal output terminal Output.

Figure 7A:
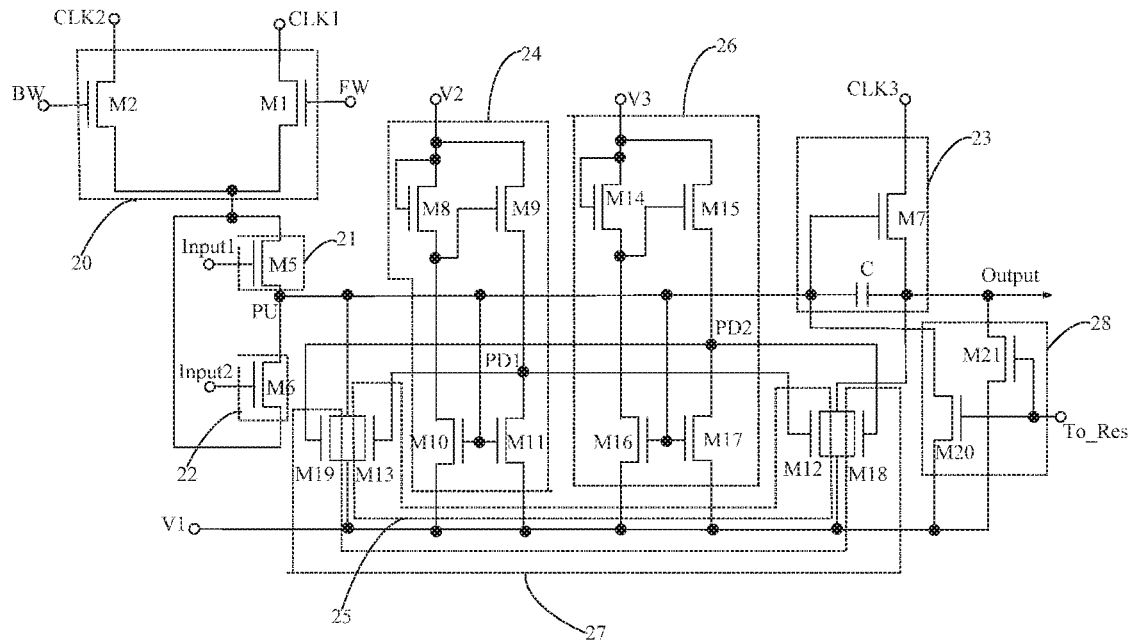
FIG. 7a is a schematic diagram showing a first circuit structure of a gate driving unit according to an embodiment of the present disclosure.
Figure 7B:
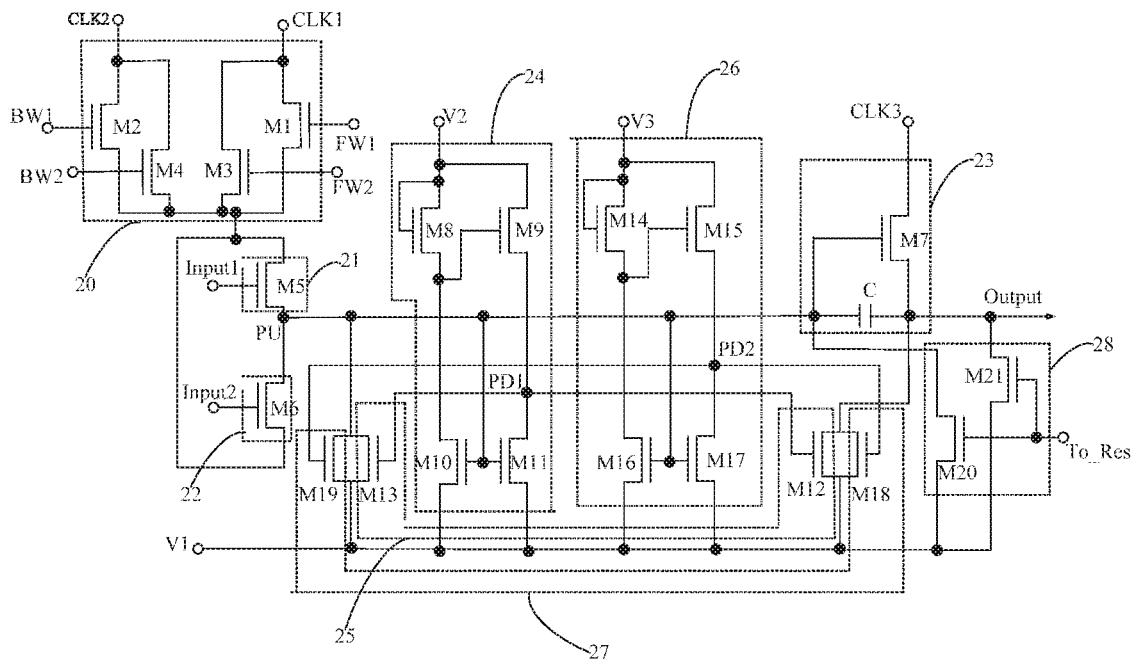
FIG. 7b is a schematic diagram showing a second circuit structure of a gate driving unit according to an embodiment of the present disclosure.

FIG. 7a is a schematic diagram showing a circuit structure of a gate driving unit according to an embodiment of the present disclosure, and FIG. 7b is a schematic diagram showing another circuit structure of the gate driving unit according to the embodiment of the present disclosure. The circuit structures shown in FIGS. 7a and 7b are two implementations of the gate driving unit shown in FIG. 6, respectively. As shown in FIG. 7a, the forward-backward scanning controller 20 has the structure of the forward-backward scanning controller 20 shown in FIG. 3, i.e., includes the first transistor M1 and the second transistor M2. The connection relationship of each of the first transistor M1 and the second transistor M2 is as described above referring to FIG. 3, and is not repeated here.

As shown in FIG. 7b, the forward-backward scanning controller 20 has the structure of the forward-backward scanning controller 20 shown in FIG. 4, i.e., includes the first transistor M1, the second transistor M2, the third transistor M3 and the fourth transistor M4. The connection relationship of each of the first transistor M1, the second transistor M2, the third transistor M3 and the fourth transistor M4 is as described above referring to FIG. 4, and is not repeated here.

In the gate driving unit shown in FIGS. 7a and 7b, the structures of the shift registers SR (i.e., the rest of the circuits shown in FIGS. 7a and 7b except the forward-backward scanning controller 20, the first clock signal terminal CLK1 and the second clock signal terminal CLK2, and may be referred to FIG. 6) may be the same, which will be described in detail below.

The forward input sub-circuit 21 includes the fifth transistor M5, the gate of the fifth transistor M5 is coupled to the forward scanning input terminal Input1, the first electrode of the fifth transistor M5 is coupled to the forward-backward scanning controller 20 (specifically, coupled to the second electrode of the first transistor M1 and the second electrode of the second transistor M2, respectively), and the second electrode of the fifth transistor M5 is coupled to the pull-up node PU. The backward input sub-circuit 22 includes the sixth transistor M6, the gate of the sixth transistor M6 is coupled to the backward scanning input terminal Input2, the first electrode of the sixth transistor M6 is coupled to the pull-up node PU, and the second electrode of the sixth transistor M6 is coupled to the forward-backward scanning controller 20 (specifically, coupled to the second electrode of the first transistor M1 and the second electrode of the second transistor M2, respectively).

The pull-up sub-circuit 23 includes a seventh transistor M7 and a capacitor C. A gate of the seventh transistor M7 is coupled to the pull-up node PU, a first electrode of the seventh transistor M7 is coupled to the third clock signal terminal CLK3, and a second electrode of the seventh transistor M7 is coupled to the signal output terminal Output. A first terminal of the capacitor C is coupled to the pull-up node PU, and a second terminal of the capacitor C is coupled to the signal output terminal Output.

The first pull-down control sub-circuit 24 includes an eighth transistor M8, a ninth transistor M9, a tenth transistor M10, and an eleventh transistor M11. For example, a gate and a first electrode of the eighth transistor M8 are both coupled to the second power supply terminal V2, and a second electrode of the eighth transistor M8 is coupled to a gate of the ninth transistor M9 and a first electrode of the tenth transistor M10. A first electrode of the ninth transistor M9 is coupled to the second power supply terminal V2, and a second electrode of the ninth transistor M9 is coupled to the first pull-down node PD1. A gate of the tenth transistor M10 is coupled to the pull-up node PU, and a second electrode of the tenth transistor M10 is coupled to the first power supply terminal V1. A gate of the eleventh transistor M11 is coupled to the pull-up node PU, a first electrode of the eleventh transistor M11 is coupled to the first pull-down node PD1, and a second electrode of the eleventh transistor M11 is coupled to the first power supply terminal V1.

The first pull-down sub-circuit 25 includes a twelfth transistor M12 and a thirteenth transistor M13. For example, a gate of the twelfth transistor M12 and a gate of the thirteenth transistor M13 are both coupled to the first pull-down node PD1, a first electrode of the twelfth transistor M12 is coupled to the signal output terminal Output, and a second electrode of the twelfth transistor M12 and a second electrode of the thirteenth transistor M13 are both coupled to the first power supply terminal V1; a first electrode of the thirteenth transistor M13 is coupled to the pull-up node PU.

The second pull-down control sub-circuit 26 includes a fourteenth transistor M14, a fifteenth transistor M15, a sixteenth transistor M16 and a seventeenth transistor M17. For example, a gate and a first electrode of the fourteenth transistor M14 are both coupled to the third power supply terminal V3, and a second electrode of the fourteenth transistor M14 is coupled to a gate of the fifteenth transistor M15 and a first electrode of the sixteenth transistor M16. A first electrode of the fifteenth transistor M15 is coupled to the third power supply terminal V3, and a second electrode of the fifteenth transistor M15 is coupled to the second pull-down node PD2. A gate of the sixteenth transistor M16 is coupled to the pull-up node PU, and a second electrode of the sixteenth transistor M16 is coupled to the first power supply terminal V1. A gate of the seventeenth transistor M17 is coupled to the pull-up node PU, a first electrode of the seventeenth transistor M17 is coupled to the second pull-down node PD2, and a second electrode of the seventeenth transistor M17 is coupled to the first power supply terminal V1.

The second pull-down sub-circuit 27 includes an eighteenth transistor M18 and a nineteenth transistor M19. A gate of the eighteenth transistor M18 and a gate of the nineteenth transistor M19 are both coupled to the second pull-down node PD2, a first electrode of the eighteenth transistor M18 is coupled to the signal output terminal Output, and a second electrode of the eighteenth transistor M18 and a second electrode of the nineteenth transistor M19 are both coupled to the first power supply terminal V1; a first electrode of the nineteenth transistor M19 is coupled to the pull-up node PU.

The reset sub-circuit 28 includes a twentieth transistor M20 and a twenty-first transistor M21. A gate of the twentieth transistor M20 and a gate of the twenty-first transistor M21 are both coupled to the reset terminal To_Res, a first electrode of the twentieth transistor M20 is coupled to the pull-up node PU, a second electrode of the twentieth transistor M20 and a second electrode of the twenty-first transistor M21 are both coupled to the first power supply terminal V1, and a first electrode of the twenty-first transistor M21 is coupled to the signal output terminal Output.

Figure 8A:
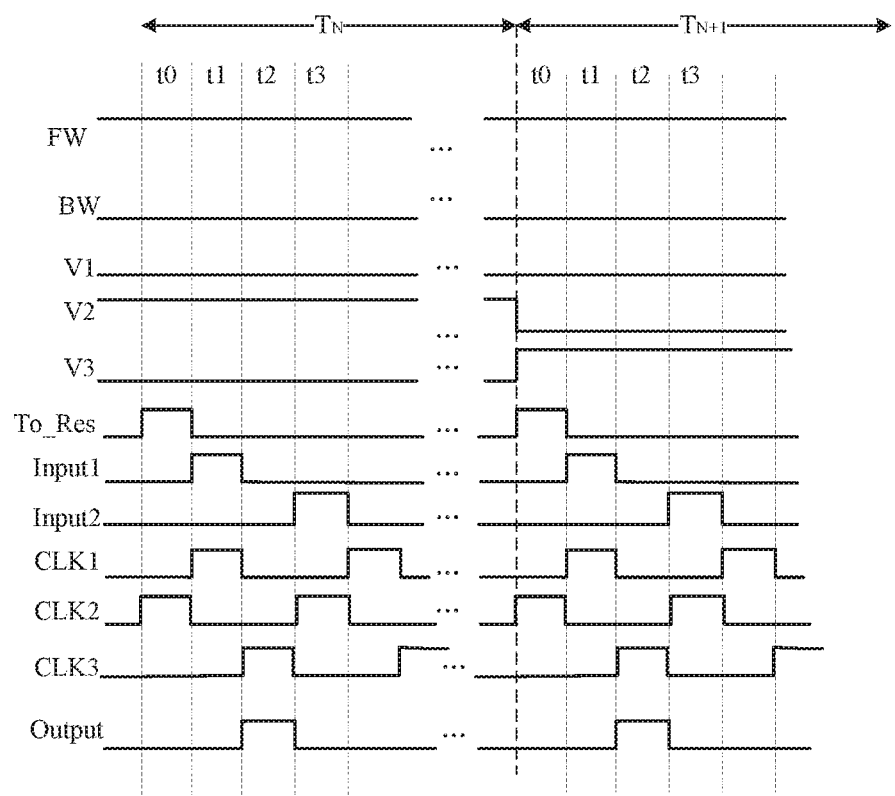
FIG. 8a is a timing diagram illustrating the operation of the gate driving unit shown in FIG. 7a during forward scanning.

FIG. 8a is a timing diagram illustrating the operation of the gate driving unit shown in FIG. 7a during the forward scanning. As shown in FIG. 8a, when the gate driving unit is performing the forward scanning, the forward scanning control terminal FW continuously provides the high level signal, the backward scanning control terminal BW continuously provides the low level signal, such that the first transistor M1 is kept turned on and the second transistor M2 is kept turned off, and the first clock signal of the first clock signal terminal CLK1 is transmitted to the first electrode of the fifth transistor M5 and the second electrode of the sixth transistor M6.

In addition, the first power supply terminal V1 provides the low level signal; the second power supply terminal V2 alternately provides the high level signal and the low level signal in every adjacent two scanning periods $T_N$ and $T_{N+1}$, the third power supply terminal V3 alternately provides the low level signal and the high level signal in every adjacent two scanning periods $T_N$ and $T_{N+1}$, and one of the second power supply terminal V2 and the third power supply terminal V3 provides the high level signal while the other of the second power supply terminal V2 and the third power supply terminal V3 provides the low level signal. The operation of the gate driving unit will be described with reference to FIGS. 7a and 8a by taking the case where the second power supply terminal V2 provides the high level signal and the third power supply terminal V3 provides the low level signal as an example. For example, each scanning period of the operation of the gate driving unit may include an initialization stage t0, a precharge stage t1, an output stage t2 and a reset stage t3, as shown in FIG. 8a. The initialization stage t0, the precharge stage t1, the output stage t2 and the reset stage t3 of the scanning period $T_N$ will be described below in more detail as an example.

During the initialization stage t0, the reset terminal To_Res provides the high level signal, and at this time, the twentieth transistor M20 and the twenty-first transistor M21 are turned on, such that the low level signal provided by the first power supply terminal V1 is transmitted to the pull-up node PU and the signal output terminal Output.

During the precharge stage t1, the first clock signal provided by the first clock signal terminal CLK1 is at the high level potential, and the second clock signal provided by the second clock signal terminal CLK2 and the third clock signal provided by the third clock signal terminal CLK3 are both at the low level potential; the forward scanning input terminal Input1 provides the high level signal, and the backward scanning input terminal Input2 provides the low level signal.

At this time, the fifth transistor M5 is turned on and the sixth transistor M6 is turned off, and the first clock signal at the high level potential charges the pull-up node PU through the fifth transistor M5, such that the pull-up node PU is at the high level potential. Under the control of the high level potential of the pull-up node PU, the tenth transistor M10, the eleventh transistor M11, the sixteenth transistor M16 and the seventeenth transistor M17 are all turned on, such that the low level signal of the first power supply terminal V1 is transmitted to the gate of the ninth transistor M9 through the tenth transistor M10, to cause the ninth transistor M9 to be turned off; the low level signal of the first power supply terminal V1 is transmitted to the first pull-down node PD1 through the eleventh transistor M11, thereby turning off both the twelfth transistor M12 and the thirteenth transistor M13; the low level signal of the first power supply terminal V1 is transmitted to the gate of the fifteenth transistor M15 through the sixteenth transistor M16, such that the fifteenth transistor M15 is turned off; the low level signal of the first power supply terminal V1 is transmitted to the second pull-down node PD2 through the seventeenth transistor M17, such that both the eighteenth transistor M18 and the nineteenth transistor M19 are turned off.

Meanwhile, under the control of the high level potential of the pull-up node PU, the seventh transistor M7 is turned on, and the third clock signal at the low level potential is transmitted to the signal output terminal Output through the seventh transistor M7, such that the signal output terminal Output outputs the low level signal.

During the output stage t2, the first clock signal provided by the first clock signal terminal CLK1 and the second clock signal provided by the second clock signal terminal CLK2 are both at the low level potential, and the third clock signal provided by the third clock signal terminal CLK3 is at the high level potential. The forward-backward scanning input terminal Input1 and the backward scanning input terminal Input2 both provide the low level signal.

At this time, the fifth transistor M5 and the sixth transistor M6 are both turned off, the pull-up node PU is in a floating state, and the transistors of the first pull-down control sub-circuit 24, the second pull-down control sub-circuit 26, the first pull-down sub-circuit 25 and the second pull-down sub-circuit 27 and the seventh transistor M7 all maintain their respective states in the precharge stage.

Under the turn-on of the seventh transistor M7, the third clock signal at the high level potential is transmitted to the signal output terminal Output through the seventh transistor M7, such that the signal output terminal Output outputs the high level signal. Meanwhile, under a bootstrapping effect of the capacitor C, the potential of the pull-up node PU will be further increased; when the third clock signal changes from the high level to the low level, the potential of the pull-up node PU will change to the state at the beginning of the output stage t2 under the bootstrapping effect of the capacitor C.

During the reset stage t3, the first clock signal provided by the first clock signal terminal CLK1 and the third clock signal provided by the third clock signal terminal CLK3 are both at the low level potential, and the second clock signal provided by the second clock signal terminal CLK2 is at the high level potential. The forward scanning input terminal Input1 provides the low level signal, and the backward scanning input terminal Input2 provides the high level signal.

At this time, the fifth transistor M5 is turned off and the sixth transistor M6 is turned on, and the first clock signal at the low level potential is transmitted to the pull-up node PU through the sixth transistor M6 to reset the pull-up node PU to the low level potential.

Since the pull-up node PU is at the low level potential, the tenth transistor M10, the eleventh transistor M11, the sixteenth transistor M16 and the seventeenth transistor M17 are all turned off. At this time, the high level signal of the second power supply terminal V2 is transmitted to the gate of the eighth transistor M8 to turn on the eighth transistor M8, and thus the high level signal of the second power supply terminal V2 is transmitted to the gate of the ninth transistor M9 through the eighth transistor M8 to turn on the ninth transistor M9; further, the high level signal of the second power supply terminal V2 is transmitted to the first pull-down node PD1 through the ninth transistor M9, thereby turning on the twelfth transistor M12 and the thirteenth transistor M13.

Since the third power supply terminal V3 provides the low level signal, the fourteenth transistor M14 is turned off, and the gate of the fifteenth transistor M15 maintains the low level potential in the output stage, such that the fifteenth transistor M15 is turned off, and the second pull-down node PD2 maintains the low level potential in the output stage.

Therefore, both the eighteenth transistor M18 and the nineteenth transistor M19 are turned off.

Since the twelfth transistor M12 and the thirteenth transistor M13 are turned on, the low level signal provided by the first power supply terminal V1 is transmitted to the pull-up node PU and the signal output terminal Output through the twelfth transistor M12 and the thirteenth transistor M13, respectively.

It should be understood that if the second power supply terminal V2 provides the low level signal and the third power supply terminal V3 provides the high level signal, operation states of the transistors of the gate driving unit at each stage are similar to the operation states of the transistors in the case where the second power supply terminal V2 provides the high level signal, except the operation states of the transistors of the second pull-down control sub-circuit 26 and the operation states of the corresponding transistors of the first pull-down control sub-circuit 24 need to be exchanged, and the operation states of the transistors of the first pull-down sub-circuit 25 and the operation states of the corresponding transistors of the second pull-down sub-circuit 27 need to be exchanged. For example, the operation state of the eighth transistor M8 when the second power supply terminal V2 provides the low level signal is the same as the operation state of the fourteenth transistor M14 when the second power supply terminal V2 provides the high level signal, and the operation state of the thirteenth transistor M13 when the second power supply terminal V2 provides the low level signal is the same as the operation state of the nineteenth transistor M19 when the second power supply terminal V2 provides the high level signal.

In addition, during a period from the end of the reset stage to the start of the initialization stage of the next scanning period, the forward scanning input terminal Input1 and the backward scanning input terminal Input2 both provide the low level signal, such that the fifth transistor M5 and the sixth transistor M6 are both turned off, and the pull-up node PU maintains the low level potential. In a case where a second operating voltage V2 is a high level operating voltage and a third operating voltage V3 is a low level operating voltage, the first pull-down node PD1 is in a high level state, the second pull-down node PD2 is in a low level state, the twelfth transistor M12 is turned on, and the eighteenth transistor M18 is turned off. In a case where the second operating voltage V2 is a low level operating voltage and the third operating voltage V3 is a high level operating voltage, the first pull-down node PD1 is at the low level potential, the second pull-down node PD2 is at the high level potential, the twelfth transistor M12 is turned off, and the eighteenth transistor M18 is turned on. Therefore, during the period from the end of the reset stage to the start of the initialization stage of the next scanning period, one of the twelfth transistor M12 and the eighteenth transistor M18 is always turned on, and the low level signal of the first power supply terminal V1 can be transmitted to the signal output terminal Output through the turned-on one of the twelfth transistor M12 and the eighteenth transistor M18, so as to maintain the signal output terminal Output outputting a low level signal. In addition, since one of the thirteenth transistor M13 and the nineteenth transistor M19 is always turned on, the low level signal of the first power supply terminal V1 is transmitted to the pull-up node PU through the turned-on one of the thirteenth transistor M13 and the nineteenth transistor M19, so as to maintain the pull-up node PU at the low level potential, thereby achieving the purpose of noise reduction.

Figure 8B:
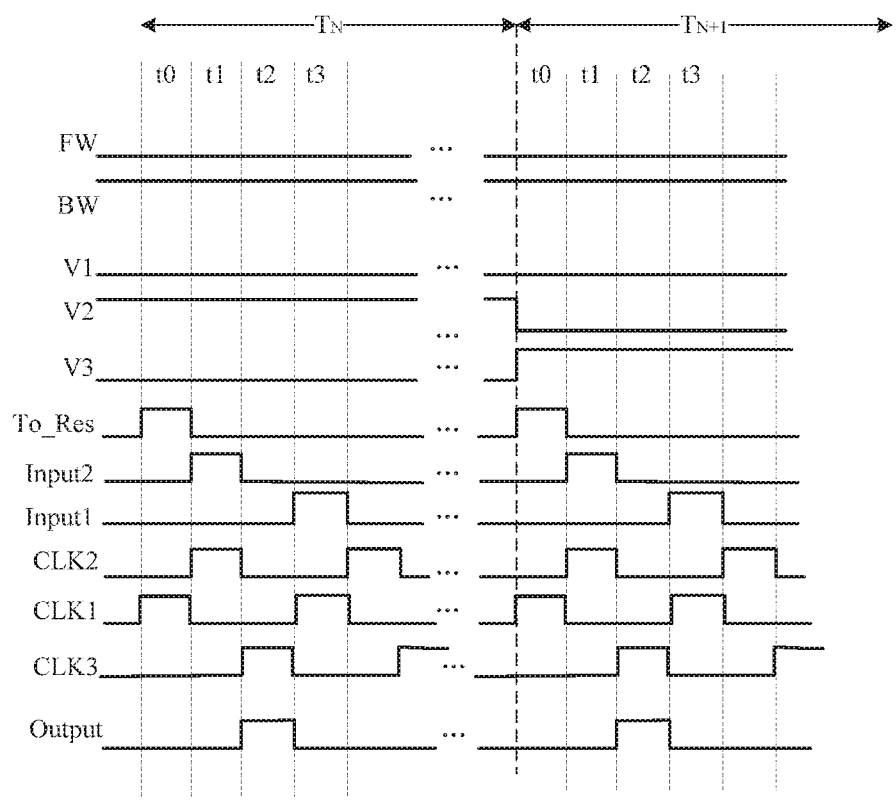
FIG. 8b is a timing diagram illustrating the operation of the gate driving unit shown in FIG. 7a during backward scanning.

FIG. 8b is a timing diagram illustrating the operation of the gate driving unit shown in FIG. 7a during the backward scanning. As shown in FIG. 8b, when the gate driving unit is performing the forward scanning, the forward scanning control terminal FW continuously provides the low level signal, and the backward scanning control terminal BW continuously provides the high level signal, such that the first transistor M1 is kept turned off and the second transistor M2 is kept turned on, and the second clock signal of the second clock signal terminal CLK2 is transmitted to the first electrode of the fifth transistor M5 and the second electrode of the sixth transistor M6.

In addition, the first power supply terminal V1 provides the low level signal. The second power supply terminal V2 alternately provides the high level signal and the low level signal in every adjacent two scanning periods $T_N$ and $T_{N+1}$, the third power supply terminal V3 alternately provides the low level signal and the high level signal in every adjacent two scanning periods $T_N$ and $T_{N+1}$, and one of the second power supply terminal V2 and the third power supply terminal V3 provides the high level signal while the other of the second power supply terminal V2 and the third power supply terminal V3 provides the low level signal. The operation of the gate driving unit will be described below with reference to FIGS. 7a and 8b by taking the case where the second power supply terminal V2 provides the high level signal and the third power supply terminal V3 provides the low level signal as an example. The initialization stage t0, the precharge stage t1, the output stage t2 and the reset stage t3 of the scanning period $T_N$ will be described below in more detail as an example.

During the initialization stage t0, the reset terminal To_Res provides the high level signal, and at this time, the twentieth transistor M20 and the twenty-first transistor M21 are turned on, such that the low level signal provided by the first power supply terminal V1 is transmitted to the pull-up node PU and the signal output terminal Output.

During the precharge stage t1, the second clock signal provided by the second clock signal terminal CLK2 is at the high level potential, and the first clock signal provided by the first clock signal terminal CLK1 and the third clock signal provided by the third clock signal terminal CLK3 are both at the low level potential; the forward scanning input terminal Input1 provides the low level signal, and the backward scanning input terminal Input2 provides the high level signal.

At this time, the fifth transistor M5 is turned off and the sixth transistor M6 is turned on, and the second clock signal at the high level potential charges the pull-up node PU through the sixth transistor M6, such that the pull-up node PU is at the high level potential. Under the control of the high level potential of the pull-up node PU, the tenth transistor M10, the eleventh transistor M11, the sixteenth transistor M16 and the seventeenth transistor M17 are all turned on, such that the low level signal of the first power supply terminal V1 is transmitted to the gate of the ninth transistor M9 through the tenth transistor M10, to cause the ninth transistor M9 to be turned off; the low level signal of the first power supply terminal V1 is transmitted to the first pull-down node PD1 through the eleventh transistor M11, thereby turning off both the twelfth transistor M12 and the thirteenth transistor M13; the low level signal of the first power supply terminal V1 is transmitted to the gate of the fifteenth transistor M15 through the sixteenth transistor M16, to cause the fifteenth transistor M15 to be turned off; and the low level signal of the first power supply terminal V1 is transmitted to the second pull-down node PD2 through the seventeenth transistor M17, such that both the eighteenth transistor M18 and the nineteenth transistor M19 are turned off.

Meanwhile, under the control of the high level potential of the pull-up node PU, the seventh transistor M7 is turned on, and the third clock signal at the low level potential is transmitted to the signal output terminal Output through the seventh transistor M7, such that the signal output terminal Output outputs the low level signal.

During the output stage t2, the first clock signal provided by the first clock signal terminal CLK1 and the second clock signal provided by the second clock signal terminal CLK2 are both at the low level potential, and the third clock signal provided by the third clock signal terminal CLK3 is at the high level potential. The forward scanning input terminal Input1 and the backward scanning input terminal Input2 both provide the low level signal.

At this time, the fifth transistor M5 and the sixth transistor M6 are both turned off, the pull-up node PU is in the floating state, and the transistors of the first pull-down control sub-circuit 24, the second pull-down control sub-circuit 26, the first pull-down sub-circuit 25 and the second pull-down sub-circuit 27 and the seventh transistor M7 all maintain their respective states in the precharge stage.

Under the turn-on of the seventh transistor M7, the third clock signal at the high level potential is transmitted to the signal output terminal Output through the seventh transistor M7, such that the signal output terminal Output outputs the high level signal. Meanwhile, under the bootstrapping effect of the capacitor C, the potential of the pull-up node PU will be further increased; when the third clock signal changes from the high level to the low level, the potential of the pull-up node PU will change to the state at the beginning of the output stage t2 under the bootstrapping effect of the capacitor C.

During the reset stage t3, the second clock signal provided by the second clock signal terminal CLK2 and the third clock signal provided by the third clock signal terminal CLK3 are both at the low level potential, and the first clock signal provided by the first clock signal terminal CLK1 is at the high level potential. The forward scanning input terminal Input1 provides the high level signal, and the backward scanning input terminal Input2 provides the low level signal.

At this time, the fifth transistor M5 is turned on and the sixth transistor M6 is turned off, and the second clock signal at the low level potential is transmitted to the pull-up node PU through the fifth transistor M5, to reset the pull-up node PU to the low level potential.

Since the pull-up node PU is at the low level potential, the tenth transistor M10, the eleventh transistor M11, the sixteenth transistor M16 and the seventeenth transistor M17 are all turned off. At this time, the high level signal of the second power supply terminal V2 is transmitted to the gate of the eighth transistor M8 to turn on the eighth transistor M8, and thus the high level signal of the second power supply terminal V2 is transmitted to the gate of the ninth transistor M9 through the eighth transistor M8 to turn on the ninth transistor M9; further, the high level signal of the second power supply terminal V2 is transmitted to the first pull-down node PD1 through the ninth transistor M9, thereby turning on the twelfth transistor M12 and the thirteenth transistor M13.

Since the third power supply terminal V3 provides the low level signal, the fourteenth transistor M14 is turned off, and the gate of the fifteenth transistor M15 keeps the low level potential in the output stage, such that the fifteenth transistor M15 is turned off, and the second pull-down node PD2 keeps the low level potential in the output stage. Accordingly, both the eighteenth transistor M18 and the nineteenth transistor M19 are turned off.

Since the twelfth transistor M12 and the thirteenth transistor M13 are turned on, the low level signal provided by the first power supply terminal V1 is transmitted to the pull-up node PU and the signal output terminal Output through the twelfth transistor M12 and the thirteenth transistor M13, respectively.

Similar to the forward scanning, during the backward scanning, if the second power supply terminal V2 provides the low level signal and the third power supply terminal V3 provides the high level signal, the operation states of the transistors of the gate driving unit at each stage are similar to the operation states of the transistors when the second power supply terminal V2 provides the high level signal, except the operation states of the transistors of the second pull-down control sub-circuit 26 and the operation states of the corresponding transistors of the first pull-down control sub-circuit 24 need to be exchanged, and the operation states of the transistors of the first pull-down sub-circuit 25 and the operation states of the corresponding transistors of the second pull-down sub-circuit 27 need to be exchanged.

In addition, similar to the forward scanning, during the backward scanning, the pull-up node PU and the signal output terminal Output both maintain the low level potential during the period from the end of the reset stage t3 to the start of the initialization stage t0 of the next scanning period.

It should be further noted that the timing diagrams shown in FIG. 8a and FIG. 8b are illustrative, and in practical applications, the initialization stage t0 is a time duration at the beginning of each scanning period. Therefore, the initialization stage t0 and the precharge stage t1 are not necessarily adjacent to each other for the gate driving unit.

For the gate driving unit shown in FIG. 7b, the forward scanning and the backward scanning thereof are similar to those of the gate driving unit shown in FIG. 7a, except that when the gate driving unit shown in FIG. 7b performs the forward scanning, as shown in FIG. 5a, the first backward scanning control terminal BW1 and the second backward scanning control terminal BW2 both provide the low level signal, and the first forward scanning control terminal FW1 and the second forward scanning control terminal FW2 alternately provide the high level signal, such that the second transistor M2 and the fourth transistor M4 are both kept turned off, and the first transistor M1 and the third transistor M3 are alternately turned on; thus, the first clock signal provided by the first clock signal terminal CLK1 is transmitted to the first electrode of the fifth transistor M5 and the second electrode of the sixth transistor M6 through the turned-on one of the first transistor M1 and the third transistor M3. When the gate driving unit shown in FIG. 7b performs the backward scanning, as shown in FIG. 5b, the first forward scanning control terminal FW1 and the second forward scanning control terminal FW2 continuously provide the low level signal, and the first backward scanning control terminal BW1 and the second backward scanning control terminal BW2 alternately provide the high level signal, such that the first transistor M1 and the third transistor M3 are kept turned off, and the second transistor M2 and the fourth transistor M4 are alternately turned on; thus, the second clock signal provided by the second clock signal terminal CLK2 is transmitted to the first electrode of the fifth transistor M5 and the second electrode of the sixth transistor M6 through the turned-on one of the second transistor M2 and the fourth transistor M4. Operation states of the transistors of the shift register SR shown in FIG. 7b are the same as the operation states of the transistors of the shift register SR shown in FIG. 7a, and detailed description thereof is not repeated here.

In each of the foregoing embodiments, the forward-backward scanning controller 20 provides the first clock signal to the forward input sub-circuit 21 and the backward input sub-circuit 22 of the shift register SR when the gate driving unit performs the forward scanning. At this time, the first electrodes (e.g., sources of the transistors, which receive the first clock signal, of the forward input sub-circuit 21 and the backward input sub-circuit 22 are no longer in a constant voltage state, thereby reducing the phenomenon that the threshold voltages of the transistors of the forward input sub-circuit 21 and the backward input sub-circuit 22 drift. Similarly, when the gate driving unit performs the backward scanning, the forward-backward scanning controller 20 provides the forward input sub-circuit 21 and the backward input sub-circuit 22 of the shift register SR with the second clock signal. At this time, the first electrodes (e.g., sources) of the transistors, which receive the second clock signal, of the forward input sub-circuit 21 and the backward input sub-circuit 22 are no longer in the constant voltage state, thereby reducing the phenomenon that the threshold voltages of the transistors of the forward input sub-circuit 21 and the backward input sub-circuit 22 drift. Therefore, the gate driving unit provided by each of the foregoing embodiments can mitigate or avoid the problem of abnormal operation of the shift register due to the drift of the threshold voltages of the transistors, thereby ensuring the normal operation of the gate driving circuit including the shift register and prolonging the lifetime of the gate driving circuit. Therefore, an excellent display effect of a display device including the gate driving circuit is ensured.

An embodiment of the present disclosure provides a driving method for a gate driving unit. This gate driving unit may be the gate driving unit according to any one of the embodiments of FIGS. 2 to 7b.

The driving method may include a step of: transmitting the first clock signal provided by the first clock signal terminal CLK1 to the forward input sub-circuit 21 and the backward input sub-circuit 22 through (or by) the forward-backward scanning controller 20 to cause the gate driving unit to perform the forward scanning. During the forward scanning, the forward scanning input terminal Input1 provides the enabling signal, and the forward input sub-circuit 21 transmits the first clock signal that is at the enabling potential and provided by the forward-backward scanning controller 20 to the pull-up node PU.

The driving method may further include a step of: during the precharge stage t1 of the forward scanning, transmitting, by the forward input sub-circuit 21, the first clock signal that is at the enabling potential and provided by the forward-backward scanning controller 20 to the pull-up node PU under the control of a forward scanning signal provided by the forward scanning input terminal Input1.

The driving method may further include steps of: during the reset stage t3 of the forward scanning, providing, by the backward scanning input terminal Input2, the enabling signal, and transmitting, by the backward input sub-circuit 22, the first clock signal that is at the disabling potential and provided by the forward-backward scanning controller 20 to the pull-up node PU.

The driving method may further include a step of: transmitting the second clock signal provided by the second clock signal terminal CLK2 to the forward input sub-circuit 21 and the backward input sub-circuit 22 through (or by) the forward-backward scanning controller 20 to cause the gate driving unit to perform the backward scanning.

The driving method may further include steps of: during the precharge stage t1 of the backward scanning, providing, by the backward scanning input terminal Input2, the enabling signal, and transmitting, by the backward input sub-circuit 22, the second clock signal that is at the enabling potential and provided by the forward-backward scanning controller 20 to the pull-up node PU.

The driving method may further include steps of: during the reset stage t3 of the backward scanning, providing, by the forward scanning input terminal Input1, the enabling signal, and transmitting, by the forward input sub-circuit 21, the second clock signal that is at the disabling potential and provided by the forward-backward scanning controller 20 to the pull-up node PU.

For example, when the forward-backward scanning controller 20 of the gate driving unit has the structure shown in FIG. 3, the step of "transmitting the first clock signal provided by the first clock signal terminal CLK1 to the forward input sub-circuit 21 and the backward input sub-circuit 22 through (or by) the forward-backward scanning controller 20 to cause the gate driving unit to perform the forward scanning" described above may include: providing, by the forward scanning control terminal FW, the enabling signal, to electrically couple the first electrode and the second electrode of the first transistor M1 to each other, so as to transmit the first clock signal to the forward input sub-circuit 21 and the backward input sub-circuit 22. The step of "transmitting the second clock signal provided by the second clock signal terminal CLK2 to the forward input sub-circuit 21 and the backward input sub-circuit 22 through (or by) the forward-backward scanning controller 20 to cause the gate driving unit to perform the backward scanning" described above may include: providing, by the backward scanning control terminal BW, the enabling signal, to electrically couple the first electrode and the second electrode of the second transistor M2 to each other, so as to transmit the second clock signal to the forward input sub-circuit 21 and the backward input sub-circuit 22.

When the forward-backward scanning controller 20 of the gate driving unit has the structure shown in FIG. 4, the step of "transmitting the first clock signal provided by the first clock signal terminal CLK1 to the forward input sub-circuit 21 and the backward input sub-circuit 22 through (or by) the forward-backward scanning controller 20 to cause the gate driving unit to perform the forward scanning" described above may include: providing, by both the first forward scanning control terminal FW1 and the second forward scanning control terminal FW2, two clock signals, wherein when one of the two clock signals is at the enabling potential, the other of the two clock signals is at the disabling potential, in a case where the signal provided by the first forward scanning control terminal FW1 is at the enabling potential, the first electrode and the second electrode of the first transistor M1 are electrically coupled to each other, so as to transmit the first clock signal to the forward input sub-circuit 21 and the backward input sub-circuit 22, and in a case where the signal provided by the second forward scanning control terminal FW2 is at the enabling potential, the first electrode and the second electrode of the third transistor M3 are electrically coupled to each other, so as to transmit the first clock signal to the forward input sub-circuit 21 and the backward input sub-circuit 22. The step of "transmitting the second clock signal provided by the second clock signal terminal CLK2 to the forward input sub-circuit 21 and the backward input sub-circuit 22 through (or by) the forward-backward scanning controller 20 to cause the gate driving unit to perform the backward scanning" described above may include: providing, by both the first backward scanning control terminal BW1 and the second backward scanning control terminal BW2, two clock signals, wherein when one of the two clock signals is at the enabling potential, the other of the two clock signals is at the disabling potential, in a case where the signal provided by the first backward scanning control terminal BW1 is at the enabling potential, the first electrode and the second electrode of the second transistor M2 are electrically coupled to each other, so as to transmit the second clock signal to the forward input sub-circuit 21 and the backward input sub-circuit 22, in a case where the signal provided by the second backward scanning control terminal BW2 is at the enabling potential, the first electrode and the second electrode of the fourth transistor M4 are electrically coupled to each other, so as to transmit the second clock signal to the forward input sub-circuit 21 and the backward input sub-circuit 22.

In addition, each of the forward scanning and the backward scanning may further include the initialization stage t0 and the output stage t2. For the detailed description of each stage of each of the forward scanning and the backward scanning, reference may be made to the foregoing description of the operation of the gate driving unit, and the detailed description is not repeated here.

Figure 9:
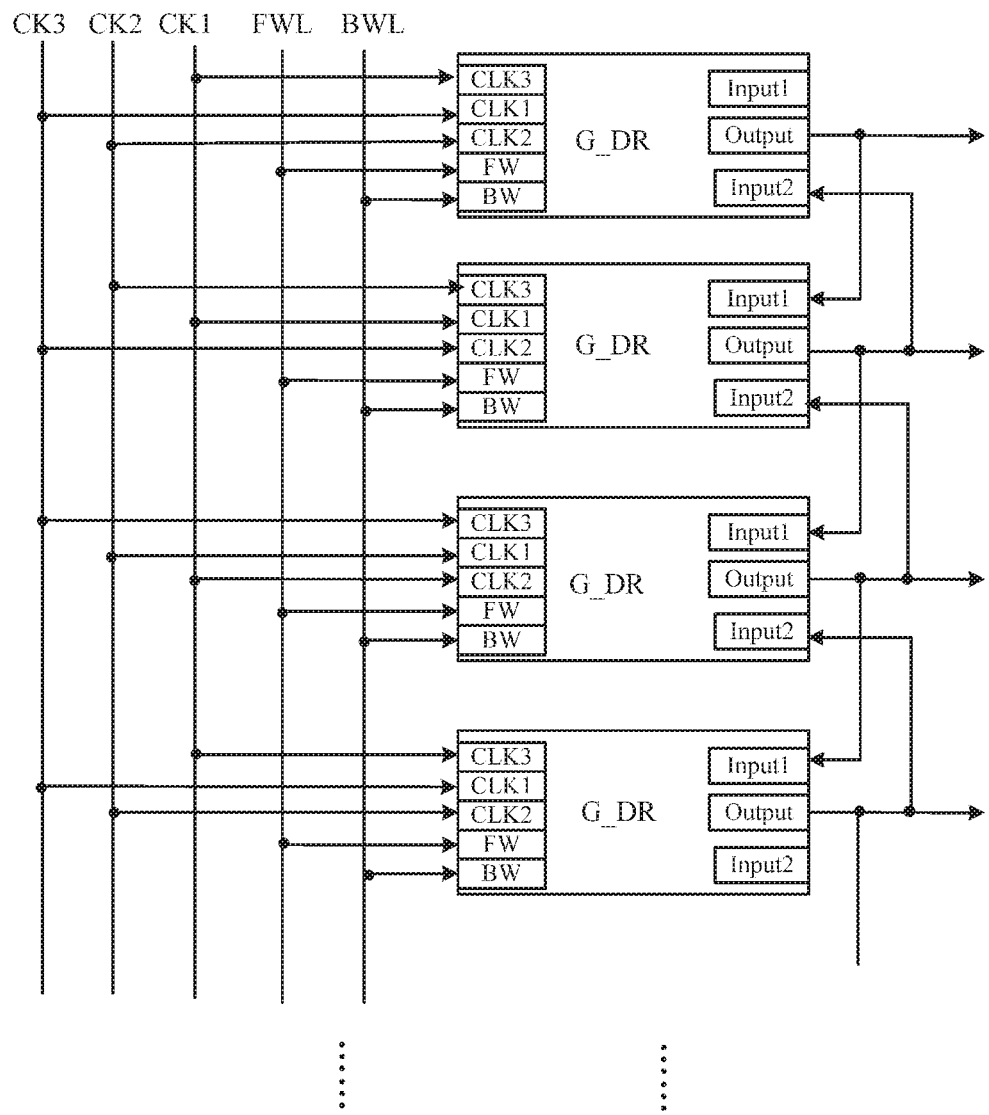
FIG. 9 is a schematic diagram showing a first structure of a gate driving circuit according to an embodiment of the present disclosure.

FIG. 9 is a schematic diagram of a first structure of a gate driving circuit according to an embodiment of the present disclosure. As shown in FIG. 9, the gate driving circuit includes a plurality of gate driving units G_DR cascaded in respective stages, and each of the plurality of gate driving units G_DR may be the gate driving unit according to any one of the embodiments of FIGS. 2 to 7b. For example, except for the gate driving unit G_DR in the last stage, the signal output terminal Output of each of the gate driving units G_DR in the remaining stages is coupled to the forward scanning input terminal Input1 of the gate driving unit G_DR in a corresponding next stage. Except for the gate driving unit G_DR in the first stage, the signal output terminal Output of each of the gate driving units in the remaining stages is coupled to the backward scanning input terminal Input2 of the gate driving unit G_DR in a corresponding previous stage.

As shown in FIG. 9, the gate driving circuit may further include a first clock signal line CK1, a second clock signal line CK2, and a third clock signal line CK3. For example, the first clock signal terminal CLK1 of the gate driving unit G_DR in stage 3n+1 (e.g., the uppermost gate driving unit G_DR in FIG. 9 is the case of n=0) is coupled to the third clock signal line CK3, the second clock signal terminal CLK2 of the gate driving unit G_DR in stage 3n+1 is coupled to the second clock signal line CK2, and the third clock signal terminal CLK3 of the gate driving unit G_DR in stage 3n+1 is coupled to the first clock signal line CK1; the first clock signal terminal CLK1 of the gate driving unit G_DR in stage 3n+2 is coupled to the first clock signal line CK1, the second clock signal terminal CLK2 of the gate driving unit G_DR in stage 3n+2 is coupled to the third clock signal terminal CK3, and the third clock signal terminal CLK3 of the gate driving unit G_DR in stage 3n+2 is coupled to the second clock signal line CK2; the first clock signal terminal CLK1 of the gate driving unit G_DR in stage 3n+3 is coupled to the second clock signal line CK2, the second clock signal terminal CLK2 of the gate driving unit G_DR in stage 3n+3 is coupled to the first clock signal line CK1, and the third clock signal terminal CLK3 of the gate driving unit G_DR in stage 3n+3 is coupled to the third clock signal line CK3. Here, n is an integer not less than 0.

In addition, in a case where the forward-backward scanning controller 20 of each of the gate driving units G_DR has the structure shown in FIG. 3, as shown in FIG. 9, the gate driving circuit may further include a forward scanning control line FWL and a backward scanning control line BWL, the forward scanning control terminal FW of each of the gate driving units G_DR is coupled to the forward scanning control line FWL, and the backward scanning control terminal BW of each of the gate driving units G_DR is coupled to the backward scanning control line BWL. In a case where the forward-backward scanning controller 20 of each of the gate driving units G_DR has the structure shown in FIG. 4, the gate driving circuit may include a first forward scanning control line, a second forward scanning control line, a first backward scanning control line and a second backward scanning control line; the first forward scanning control line is coupled to the first forward scanning control terminal FW1 of each of the gate driving units G_DR, the second forward scanning control line is coupled to the second forward scanning control terminal FW2 of each of the gate driving units G_DR, the first backward scanning control line is coupled to the first backward scanning control terminal BW1 of each of the gate driving units G_DR, and the second backward scanning control line is coupled to the second backward scanning control terminal BW2 of each of the gate driving units G_DR; so as to provide the signals shown in FIG. 5a to each of the gate driving units during the forward scanning, and provide the signals as shown in FIG. 5b to each of the gate driving units G_DR during the backward scanning.

Figure 10:
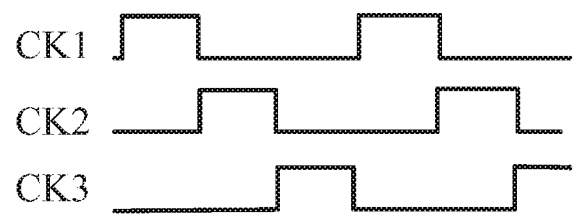
FIG. 10 is a waveform diagram of clock signals provided by three clock signal lines when the gate driving circuit shown in FIG. 9 performs forward scanning.

FIG. 10 is a waveform diagram of clock signals provided by the first clock signal line CK1, the second clock signal line CK2 and the third clock signal line CK3 when the gate driving circuit shown in FIG. 9 performs the forward scanning. As shown in FIG. 10, a duty ratio of each of the clock signals provided by the first clock signal line CK1, the second clock signal line CK2 and the third clock signal line CK3 is ⅓. In addition, when the gate driving circuit shown in FIG. 9 performs the backward scanning, all that needs to be changed is to merely exchange the clock signal provided by the first clock signal line CK1 and the clock signal provided by the third clock signal line CK3 shown in FIG. 10.

Figure 11:
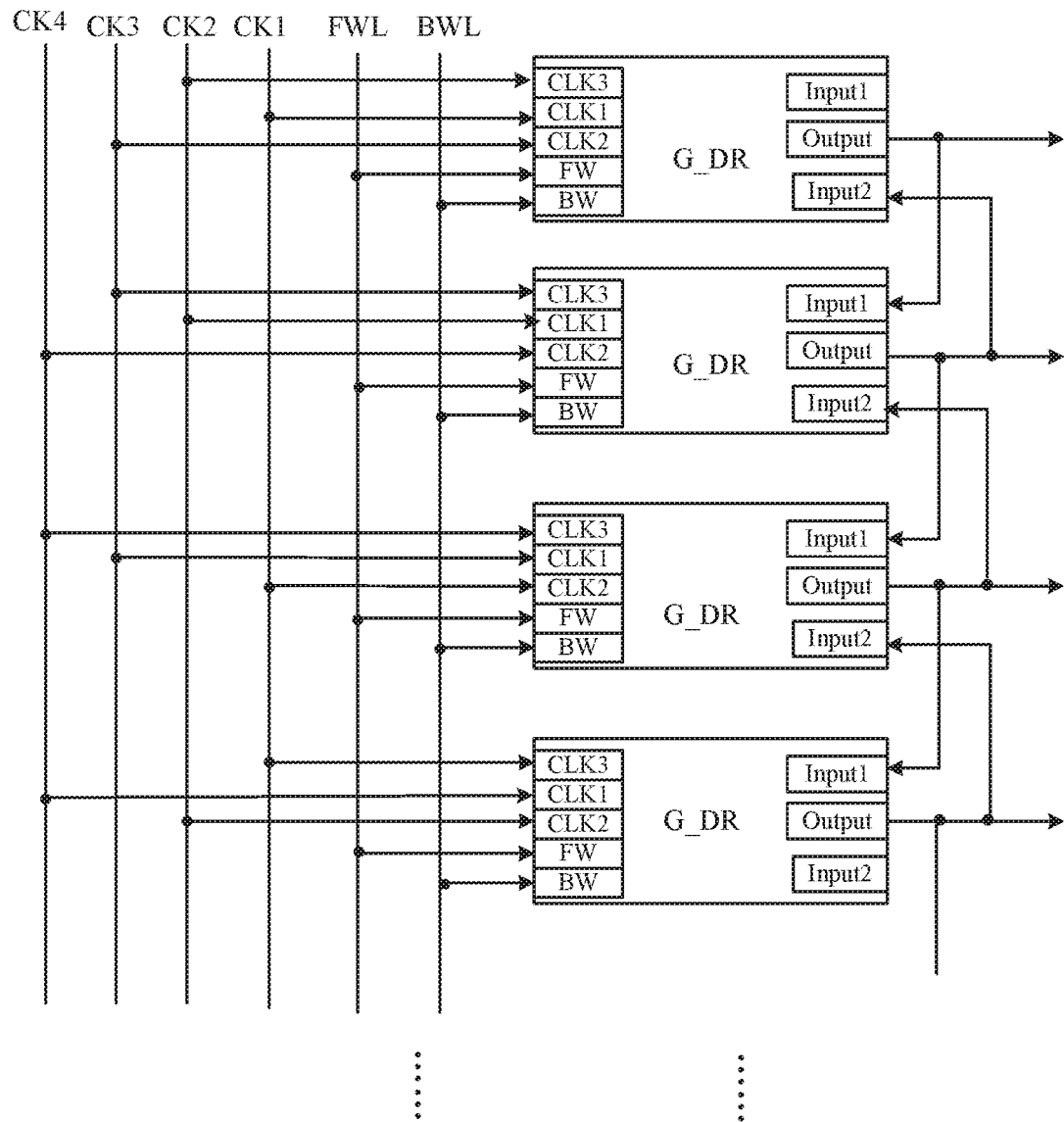
FIG. 11 is a schematic diagram showing a second structure of a gate driving circuit according to an embodiment of the present disclosure.

FIG. 11 is a schematic diagram showing a second structure of the gate driving circuit according to an embodiment of the present disclosure. As shown in FIG. 11, the gate driving circuit includes a plurality of gate driving units G_DR cascaded in respective stages, and each of the plurality of gate driving units G_DR may be the gate driving unit according to any one of the embodiments of FIGS. 2 to 7b. For example, the connection relationship between the gate driving units G_DR in the respective stages is the same as that in FIG. 9. Unlike the structure shown in FIG. 9, in FIG. 11, the gate driving circuit having the second structure includes four clock signal lines which are a first clock signal line CK1, a second clock signal line CK2, a third clock signal line CK3, and a fourth clock signal line CK4.

For example, the first clock signal terminal CLK1 of the gate driving unit G_DR in stage 4n+1 is coupled to the first clock signal line CK1, the second clock signal terminal CLK2 of the gate driving unit G_DR in stage 4n+1 is coupled to the third clock signal line CK3, and the third clock signal terminal CLK3 of the gate driving unit G_DR in stage 4n+1 is coupled to the second clock signal line CK2. The first clock signal terminal CLK1 of the gate driving unit G_DR in stage 4n+2 is coupled to the second clock signal line CK2, the second clock signal terminal CLK2 of the gate driving unit G_DR in stage 4n+2 is coupled to the fourth clock signal line CK4, and the third clock signal terminal CLK3 of the gate driving unit G_DR in stage 4n+2 is coupled to the third clock signal line CK3. The first clock signal terminal CLK1 of the gate driving unit G_DR in stage 4n+3 is coupled to the third clock signal line CK3, the second clock signal terminal CLK2 of the gate driving unit G_DR in stage 4n+3 is coupled to the first clock signal line CK1, and the third clock signal terminal CLK3 of the gate driving unit G_DR in stage 4n+3 is coupled to the fourth clock signal line CK4. The first clock signal terminal CLK1 of the gate driving unit G_DR in stage 4n+4 is coupled to the fourth clock signal line CK4, the second clock signal terminal CLK2 of the gate driving unit G_DR in stage 4n+4 is coupled to the second clock signal line CK2, and the third clock signal terminal CLK3 of the gate driving unit G_DR in stage 4n+4 is coupled to the first clock signal line CK1. Here, n is an integer not less than 0.

Similar to FIG. 9, in FIG. 11, in a case where the forward-backward scanning controller 20 of each of the gate driving units G_DR has the structure shown in FIG. 3, the gate driving circuit may further include a forward scanning control line FWL and a backward scanning control line BWL; in a case where the forward-backward scanning controller 20 of each of the gate driving units G_DR has the structure shown in FIG. 4, the gate driving circuit may further include a first forward scanning control line, a second forward scanning control line, a first backward scanning control line, and a second backward scanning control line.

Figure 12:
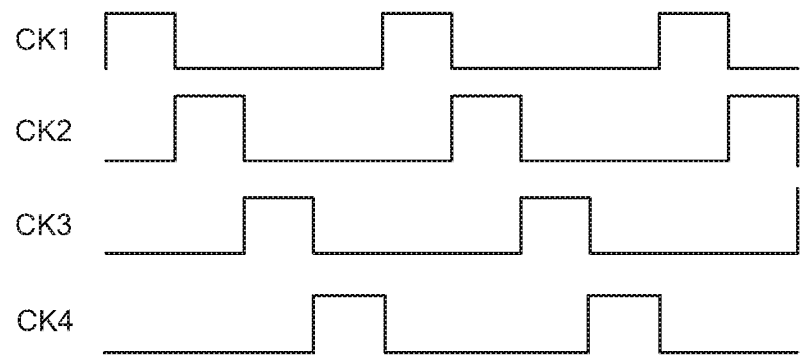
FIG. 12 is a waveform diagram of clock signals provided by four clock signal lines when the gate driving circuit shown in FIG. 11 performs forward scanning.

FIG. 12 is a waveform diagram of clock signals provided by the first clock signal line CK1, the second clock signal line CK2, the third clock signal line CK3 and the fourth clock signal line CK4 when the gate driving circuit shown in FIG. 11 performs the forward scanning. As shown in FIG. 12, a duty ratio of each of the clock signals provided by the first clock signal line CK1, the second clock signal line CK2, the third clock signal line CK3 and the fourth clock signal line CK4 is ¼. In a case where the gate driving circuit shown in FIG. 11 performs the backward scanning, all that needs to be changed is to exchange the clock signal of the first clock signal line CK1 and the clock signal of the fourth clock signal line CK4 shown in FIG. 12, and exchange the clock signal of the second clock signal line CK2 and the clock signal of the third clock signal line CK3 shown in FIG. 12.

An embodiment of the present disclosure provides a display device including any one of the gate driving circuits shown in FIGS. 9 and 11.

The display device may further include an array substrate, the array substrate includes a plurality of gate lines, and the signal output terminals of the gate driving units of the gate driving circuit are coupled to the gate lines in a one-to-one correspondence manner, such that scanning signals are successively provided to the plurality of gate lines.

In an embodiment, each of the clock signals in the present disclosure may be a square wave signal.

It should be understood that the above embodiments are merely exemplary embodiments for explaining the principle of the present disclosure, and the present disclosure is not limited thereto. It will be apparent to one of ordinary skill in the art that various changes and modifications can be made therein without departing from the spirit and essence of the present disclosure, and these changes and modifications also fall within the scope of the present disclosure.

What is claimed is:

1. A gate driving unit, comprising a shift register and a forward-backward scanning controller, the shift register comprising a forward input sub-circuit and a backward input sub-circuit, wherein
the forward-backward scanning controller is coupled to a first clock signal terminal, a second clock signal terminal, the forward input sub-circuit and the backward input sub-circuit, respectively, and is configured to transmit a first clock signal provided by the first clock signal terminal to the forward input sub-circuit and the backward input sub-circuit to enable the gate driving unit to perform forward scanning, and transmit a second clock signal provided by the second clock signal terminal to the forward input sub-circuit and the backward input sub-circuit to enable the gate driving unit to perform backward scanning;
the forward input sub-circuit is coupled to a forward scanning input terminal and a pull-up node of the shift register, respectively, and is configured to transmit a signal provided by the forward-backward scanning controller to the pull-up node under control of an enabling signal provided by the forward scanning input terminal; and
the backward input sub-circuit is coupled to a backward scanning input terminal and the pull-up node, respectively, and is configured to transmit the signal provided by the forward-backward scanning controller to the pull-up node under control of an enabling signal provided by the backward scanning input terminal.

2. The gate driving unit according to claim 1, wherein the forward-backward scanning controller comprises a first transistor and a second transistor;
the first transistor comprises a gate coupled to a forward scanning control terminal, a first electrode coupled to the first clock signal terminal, and a second electrode coupled to the forward input sub-circuit and the backward input sub-circuit, respectively, and the forward scanning control terminal is configured to provide an enabling signal for the forward scanning and provide a disabling signal for the backward scanning; and
the second transistor comprises a gate coupled to a backward scanning control terminal, a first electrode coupled to the second clock signal terminal, and a second electrode coupled to the forward input sub-circuit and the backward input sub-circuit, respectively, and the backward scanning control terminal is configured to provide a disabling signal for the forward scanning and provide an enabling signal for the backward scanning.

3. The gate driving unit according to claim 1, wherein the forward-backward scanning controller comprises a first transistor, a second transistor, a third transistor, and a fourth transistor;
the first transistor and the third transistor are coupled in parallel between the first clock signal terminal and the shift register;
the second transistor and the fourth transistor are coupled in parallel between the second clock signal terminal and the shift register;
the first transistor comprises a gate coupled to a first forward scanning control terminal, a first electrode coupled to the first clock signal terminal, and a second electrode coupled to both the forward input sub-circuit and the backward input sub-circuit;
the second transistor comprises a gate coupled to a first backward scanning control terminal, a first electrode coupled to the second clock signal terminal, and a second electrode coupled to both the forward input sub-circuit and the backward input sub-circuit;

the third transistor comprises a gate coupled to a second forward scanning control terminal, a first electrode coupled to the first clock signal terminal, and a second electrode coupled to both the forward input sub-circuit and the backward input sub-circuit;

the fourth transistor comprises a gate coupled to a second backward scanning control terminal, a first electrode coupled to the second clock signal terminal, and a second electrode coupled to both the forward input sub-circuit and the backward input sub-circuit;

both the first forward scanning control terminal and the second forward scanning control terminal are configured to provide disabling signals during the backward scanning and provide two clock signals during the forward scanning, respectively, and when one of the two clock signals is at an enabling potential, the other of the two clock signals is at a disabling potential; and both the first backward scanning control terminal and the second backward scanning control terminal are configured to provide a disabling signal during the forward scanning and provide two clock signals during the backward scanning, and when one of the two clock signals is at an enabling potential, the other of the two clock signals is at a disabling potential.

4. The gate driving unit according to claim 1, wherein the forward input sub-circuit comprises a fifth transistor, and the fifth transistor comprises a gate coupled to the forward scanning input terminal, a first electrode coupled to the forward-backward scanning controller, and a second electrode coupled to the pull-up node.

5. The gate driving unit according to claim 1, wherein the backward input sub-circuit comprises a sixth transistor, and the sixth transistor comprises a gate coupled to the backward scanning input terminal, a first electrode coupled to the pull-up node, and a second electrode coupled to the forward-backward scanning controller.

6. The gate driving unit according to claim 1, wherein the shift register further comprises a pull-up sub-circuit, a first pull-down control sub-circuit, and a first pull-down sub-circuit, wherein the first pull-down control sub-circuit and the first pull-down sub-circuit are coupled to each other at a first pull-down node;

the pull-up sub-circuit is coupled to the pull-up node, a signal output terminal, and a third clock signal terminal, respectively, and is configured to transmit a third clock signal provided by the third clock signal terminal to the signal output terminal when the pull-up node is at an enabling potential;

the first pull-down control sub-circuit is coupled to the pull-up node, the first pull-down node, a first power supply terminal, and a second power supply terminal, respectively, and is configured to transmit a signal provided by the first power supply terminal to the first pull-down node when the pull-up node is at the enabling potential, and transmit a signal provided by the second power supply terminal to the first pull-down node when the pull-up node is at a disabling potential; and the first pull-down sub-circuit is coupled to the first pull-down node, the pull-up node, the signal output terminal, and the first power supply terminal, respectively, and is configured to transmit the signal provided by the first power supply terminal to the pull-up node and the signal output terminal when the first pull-down node is at an enabling potential.

7. The gate driving unit according to claim 6, wherein the pull-up sub-circuit comprises a seventh transistor and a capacitor;

the seventh transistor comprises a gate coupled to the pull-up node, a first electrode coupled to the third clock signal terminal, and a second electrode coupled to the signal output terminal; and the capacitor comprises a first terminal coupled to the pull-up node, and a second terminal coupled to the signal output terminal.

8. The gate driving unit according to claim 6, wherein the first pull-down control sub-circuit comprises an eighth transistor, a ninth transistor, a tenth transistor, and an eleventh transistor;

the eighth transistor comprises a gate and a first electrode both coupled to the second power supply terminal, and a second electrode coupled to both a gate of the ninth transistor and a first electrode of the tenth transistor;

the ninth transistor comprises a first electrode coupled to the second power supply terminal, and a second electrode coupled to the first pull-down node;

the tenth transistor comprises a gate coupled to the pull-up node, and a second electrode coupled to the first power supply terminal; and the eleventh transistor comprises a gate coupled to the pull-up node, a first electrode coupled to the first pull-down node, and a second electrode coupled to the first power supply terminal.

9. The gate driving unit according to claim 6, wherein the first pull-down sub-circuit comprises a twelfth transistor and a thirteenth transistor; and a gate of the twelfth transistor and a gate of the thirteenth transistor are both coupled to the first pull-down node, a first electrode of the twelfth transistor is coupled to the signal output terminal, a second electrode of the twelfth transistor and a second electrode of the thirteenth transistor are both coupled to the first power supply terminal, and a first electrode of the thirteenth transistor is coupled to the pull-up node.

10. The gate driving unit according to claim 6, wherein the shift register further comprises a second pull-down sub-circuit and a second pull-down control sub-circuit, wherein the second pull-down control sub-circuit and the second pull-down sub-circuit are coupled to each other at a second pull-down node;

the second pull-down control sub-circuit is coupled to the pull-up node, the second pull-down node, the first power supply terminal, and a third power supply terminal, respectively, and is configured to transmit the signal provided by the first power supply terminal to the second pull-down node when the pull-up node is at the enabling potential and transmit a signal provided by the third power supply terminal to the second pull-down node when the pull-up node is at the disabling potential; and the second pull-down sub-circuit is coupled to the second pull-down node, the pull-up node, the signal output terminal, and the first power supply terminal, respectively, and is configured to transmit the signal provided by the first power supply terminal to the pull-up node and the signal output terminal when the second pull-down node is at an enabling potential.

11. The gate driving unit according to claim 10, wherein the second pull-down control sub-circuit comprises a fourteenth transistor, a fifteenth transistor, a sixteenth transistor, and a seventeenth transistor;
  the fourteenth transistor comprises a gate and a first electrode both coupled to the third power supply terminal, and a second electrode coupled to both a gate of the fifteenth transistor and a first electrode of the sixteenth transistor;
  the fifteenth transistor comprises a first electrode coupled to the third power supply terminal, and a second electrode coupled to the second pull-down node;
  the sixteenth transistor comprises a gate coupled to the pull-up node, and a second electrode coupled to the first power supply terminal; and
  the seventeenth transistor comprises a gate coupled to the pull-up node, a first electrode coupled to the second pull-down node, and a second electrode coupled to the first power supply terminal.

12. The gate driving unit according to claim 10, wherein, the second pull-down sub-circuit comprises an eighteenth transistor and a nineteenth transistor; and
  a gate of the eighteenth transistor and a gate of the nineteenth transistor are both coupled to the second pull-down node, a first electrode of the eighteenth transistor is coupled to the signal output terminal, a second electrode of the eighteenth transistor and a second electrode of the nineteenth transistor are both coupled to the first power supply terminal, and a first electrode of the nineteenth transistor is coupled to the pull-up node.

13. The gate driving unit according to claim 6, wherein the shift register further comprises a reset sub-circuit, the reset sub-circuit is coupled to a reset terminal, the first power supply terminal, the pull-up node, and the signal output terminal, respectively, and is configured to transmit the signal provided by the first power supply terminal to the pull-up node and the signal output terminal when the reset terminal is at an enabling potential.

14. The gate driving unit according to claim 13, wherein the reset sub-circuit comprises a twentieth transistor and a twenty-first transistor, a gate of the twentieth transistor and a gate of the twenty-first transistor are both coupled to the reset terminal, a first electrode of the twentieth transistor is coupled to the pull-up node, a second electrode of the twentieth transistor and a second electrode of the twenty-first transistor are both coupled to the first power supply terminal, and a first electrode of the twenty-first transistor is coupled to the signal output terminal.

15. A method for driving a gate driving unit, wherein the gate driving unit is the gate driving unit according to claim 1, and the method comprises:
  transmitting, by the forward-backward scanning controller, the first clock signal provided by the first clock signal terminal to the forward input sub-circuit and the backward input sub-circuit to perform the forward scanning;
  during a precharge stage of the forward scanning, providing, by the forward scanning input terminal, the enabling signal, and transmitting, by the forward input sub-circuit, the first clock signal that is at an enabling potential and provided by the forward-backward scanning controller to the pull-up node;
  during a reset stage of the forward scanning, providing, by the backward scanning input terminal, the enabling signal, and transmitting, by the backward input sub-circuit, the first clock signal that is at a disabling potential and provided by the forward-backward scanning controller to the pull-up node;
  transmitting, by the forward-backward scanning controller, the second clock signal provided by the second clock signal terminal to the forward input sub-circuit and the backward input sub-circuit to perform the backward scanning;
  during a precharge stage of the backward scanning, providing, by the backward scanning input terminal, the enabling signal, and transmitting, by the backward input sub-circuit, the second clock signal that is at an enabling potential and provided by the forward-backward scanning controller to the pull-up node; and
  during a reset stage of the backward scanning, providing, by the forward scanning input terminal, the enabling signal, and transmitting, by the forward input sub-circuit, the second clock signal that is at a disabling potential and provided by the forward-backward scanning controller to the pull-up node.

16. The method according to claim 15, wherein the forward-backward scanning controller comprises a first transistor and a second transistor;
  the first transistor comprises a gate coupled to a forward scanning control terminal, a first electrode coupled to the first clock signal terminal, and a second electrode coupled to the forward input sub-circuit and the backward input sub-circuit, respectively, and the forward scanning control terminal is configured to provide an enabling signal for the forward scanning and provide a disabling signal for the backward scanning; and
  the second transistor comprises a gate coupled to a backward scanning control terminal, a first electrode coupled to the second clock signal terminal, and a second electrode coupled to the forward input sub-circuit and the backward input sub-circuit, respectively, and the backward scanning control terminal is configured to provide a disabling signal for the forward scanning and provide an enabling signal for the backward scanning;
  the transmitting, by the forward-backward scanning controller, the first clock signal provided by the first clock signal terminal to the forward input sub-circuit and the backward input sub-circuit to perform the forward scanning comprises: providing, by the forward scanning control terminal, the enabling signal to electrically couple the first electrode and the second electrode of the first transistor to each other, so as to transmit the first clock signal to the forward input sub-circuit and the backward input sub-circuit; and
  the transmitting, by the forward-backward scanning controller, the second clock signal provided by the second clock signal terminal to the forward input sub-circuit and the backward input sub-circuit to perform the backward scanning comprises: providing, by the backward scanning control terminal, the enabling signal to electrically couple the first electrode and the second electrode of the second transistor to each other, so as to transmit the second clock signal to the forward input sub-circuit and the backward input sub-circuit.

17. The method according to claim 15, wherein the forward-backward scanning controller comprises a first transistor, a second transistor, a third transistor, and a fourth transistor;
  the first transistor and the third transistor are coupled in parallel between the first clock signal terminal and the shift register;

the second transistor and the fourth transistor are coupled in parallel between the second clock signal terminal and the shift register;

the first transistor comprises a gate coupled to a first forward scanning control terminal, a first electrode coupled to the first clock signal terminal, and a second electrode coupled to both the forward input sub-circuit and the backward input sub-circuit;

the second transistor comprises a gate coupled to a first backward scanning control terminal, a first electrode coupled to the second clock signal terminal, and a second electrode coupled to both the forward input sub-circuit and the backward input sub-circuit;

the third transistor comprises a gate coupled to a second forward scanning control terminal, a first electrode coupled to the first clock signal terminal, and a second electrode coupled to both the forward input sub-circuit and the backward input sub-circuit;

the fourth transistor comprises a gate coupled to a second backward scanning control terminal, a first electrode coupled to the second clock signal terminal, and a second electrode coupled to both the forward input sub-circuit and the backward input sub-circuit;

both the first forward scanning control terminal and the second forward scanning control terminal are configured to provide disabling signals during the backward scanning and provide two clock signals during the forward scanning, respectively, and when one of the two clock signals is at an enabling potential, the other of the two clock signals is at a disabling potential; and both the first backward scanning control terminal and the second backward scanning control terminal are configured to provide a disabling signal during the forward scanning and provide two clock signals during the backward scanning, and when one of the two clock signals is at an enabling potential, the other of the two clock signals is at a disabling potential;

the transmitting, by the forward-backward scanning controller, the first clock signal provided by the first clock signal terminal to the forward input sub-circuit and the backward input sub-circuit to perform the forward scanning comprises:

providing, by both the first forward scanning control terminal and the second forward scanning control terminal, two clock signals, wherein when one of the two clock signals is at an enabling potential, the other of the two clock signals is at a disabling potential; in a case where the signal provided by the first forward scanning control terminal is at the enabling potential, the first electrode and the second electrode of the first transistor are electrically coupled to each other so as to transmit the first clock signal to the forward input sub-circuit and the backward input sub-circuit; in a case where the signal provided by the second forward scanning control terminal is at the enabling potential, the first electrode and the second electrode of the third transistor are electrically coupled to each other so as to transmit the first clock signal to the forward input sub-circuit and the backward input sub-circuit; and the transmitting, by the forward-backward scanning controller, the second clock signal provided by the second clock signal terminal to the forward input sub-circuit and the backward input sub-circuit to perform the backward scanning comprises:

providing, by both the first backward scanning control terminal and the second backward scanning control terminal, two clock signals, wherein when one of the two clock signals is at an enabling potential, the other of the two clock signals is at a disabling potential; in a case where the signal provided by the first backward scanning control terminal is at the enabling potential, the first electrode and the second electrode of the second transistor are electrically coupled to each other so as to transmit the second clock signal to the forward input sub-circuit and the backward input sub-circuit; in a case where the signal provided by the second backward scanning control terminal is at the enabling potential, the first electrode and the second electrode of the fourth transistor are electrically coupled to each other so as to transmit the second clock signal to the forward input sub-circuit and the backward input sub-circuit.

18. The method according to claim 15, wherein the shift register further comprises a pull-up sub-circuit, a first pull-down control sub-circuit, and a first pull-down sub-circuit, wherein the first pull-down control sub-circuit and the first pull-down sub-circuit are coupled to each other at a first pull-down node;

the pull-up sub-circuit is coupled to the pull-up node, a signal output terminal, and a third clock signal terminal, respectively, and is configured to transmit a third clock signal provided by the third clock signal terminal to the signal output terminal when the pull-up node is at an enabling potential;

the first pull-down control sub-circuit is coupled to the pull-up node, the first pull-down node, a first power supply terminal, and a second power supply terminal, respectively, and is configured to transmit a signal provided by the first power supply terminal to the first pull-down node when the pull-up node is at the enabling potential, and transmit a signal provided by the second power supply terminal to the first pull-down node when the pull-up node is at a disabling potential; and the first pull-down sub-circuit is coupled to the first pull-down node, the pull-up node, the signal output terminal, and the first power supply terminal, respectively, and is configured to transmit the signal provided by the first power supply terminal to the pull-up node and the signal output terminal when the first pull-down node is at an enabling potential;

the shift register further comprises a second pull-down sub-circuit and a second pull-down control sub-circuit, wherein the second pull-down control sub-circuit and the second pull-down sub-circuit are coupled to each other at a second pull-down node;

the second pull-down control sub-circuit is coupled to the pull-up node, the second pull-down node, the first power supply terminal, and a third power supply terminal, respectively, and is configured to transmit the signal provided by the first power supply terminal to the second pull-down node when the pull-up node is at the enabling potential and transmit a signal provided by the third power supply terminal to the second pull-down node when the pull-up node is at the disabling potential; and the second pull-down sub-circuit is coupled to the second pull-down node, the pull-up node, the signal output terminal, and the first power supply terminal, respectively, and is configured to transmit the signal provided by the first power supply terminal to the pull-up node and the signal output terminal when the second pull-down node is at an enabling potential; and each of the signal provided by the second power supply terminal and the signal provided by the third power supply terminal is a signal switching between an enabling potential and a disabling potential; and at any time, one of the signal provided by the second power supply terminal and the signal provided by the third power supply terminal is at the enabling potential, and the other of the signal provided by the second power supply terminal and the signal provided by the third power supply terminal is at the disabling potential.

19. A gate driving circuit, comprising a plurality of gate driving units cascaded in respective stages, wherein each of the plurality of gate driving units is the gate driving unit according to claim 1;

except the gate driving unit in a last stage, a signal output terminal of each of the gate driving units in the remaining stages of the plurality of gate driving units is coupled to the forward scanning input terminal of the gate driving unit in a corresponding next stage; and except the gate driving unit in a first stage, the signal output terminal of each of the gate driving units in the remaining stages of the plurality of gate driving units is coupled to the backward scanning input terminal of the gate driving unit in a corresponding previous stage.

20. A display device, comprising the gate driving circuit according to claim 19.

* * * * *